United States Patent
Kamata et al.

[11] Patent Number: 5,846,885
[45] Date of Patent: Dec. 8, 1998

[54] PLASMA TREATMENT METHOD

[75] Inventors: Takeshi Kamata; Hiroshi Arimoto; Makoto Kosugi; Koichi Hashimoto, all of Kanagawa, Japan

[73] Assignee: Fujitsu Limited, Kawasaki, Japan

[21] Appl. No.: 702,161

[22] Filed: Aug. 23, 1996

[30] Foreign Application Priority Data

Aug. 23, 1995 [JP] Japan .................................. 7-214538

[51] Int. Cl.$^6$ .................................................. H01L 21/00
[52] U.S. Cl. .............................. 438/729; 216/71; 216/67; 438/710
[58] Field of Search ................ 156/625.1, 643.1, 156/646.1, 345 V, 345 P, 345 C, 345 MW; 118/723 R, 723 MW, 723 I, 723 E; 216/58, 63, 67, 68, 69, 71; 204/192.32, 192.33, 298.31, 298.33, 298.37; 438/710, 729

[56] References Cited

U.S. PATENT DOCUMENTS

| | | | |
|---|---|---|---|
| 4,579,618 | 4/1986 | Celestino et al. | 156/345 |
| 4,610,770 | 9/1986 | Saito et al. | 204/192.1 |
| 4,931,169 | 6/1990 | Scherer et al. | 204/298.11 |
| 5,032,205 | 7/1991 | Hershkowitz et al. | 156/345 |
| 5,082,685 | 1/1992 | Morooka | 427/38 |
| 5,110,438 | 5/1992 | Ohmi et al. | 204/298.34 |
| 5,272,417 | 12/1993 | Ohmi | 315/111.21 |
| 5,449,432 | 9/1995 | Hanawa | 156/643.1 |
| 5,556,501 | 9/1996 | Collins et al. | 156/345 |
| 5,567,268 | 10/1996 | Kadomura | 156/345 |

*Primary Examiner*—R. Bruce Breneman
*Assistant Examiner*—Luz Alejandro
*Attorney, Agent, or Firm*—Armstrong, Westerman, Hattori, McLeland, & Naughton

[57] ABSTRACT

In a plasma equipment and a plasma treatment method of a semiconductor device capable of reducing electron shading effect and also suppressing charge damage without affecting various characteristics in plasma process, a distance between a substrate bias electrode and A counter electrode is set less than two times as long as a mean free path of electron. High frequency electric power of 100 kHz to 1 MHz is supplied to the substrate bias electrode, while high frequency electric power of 1 MHz to 100 MHz is supplied to the counter electrode.

24 Claims, 30 Drawing Sheets

FIG.6 (EMBODIMENT)
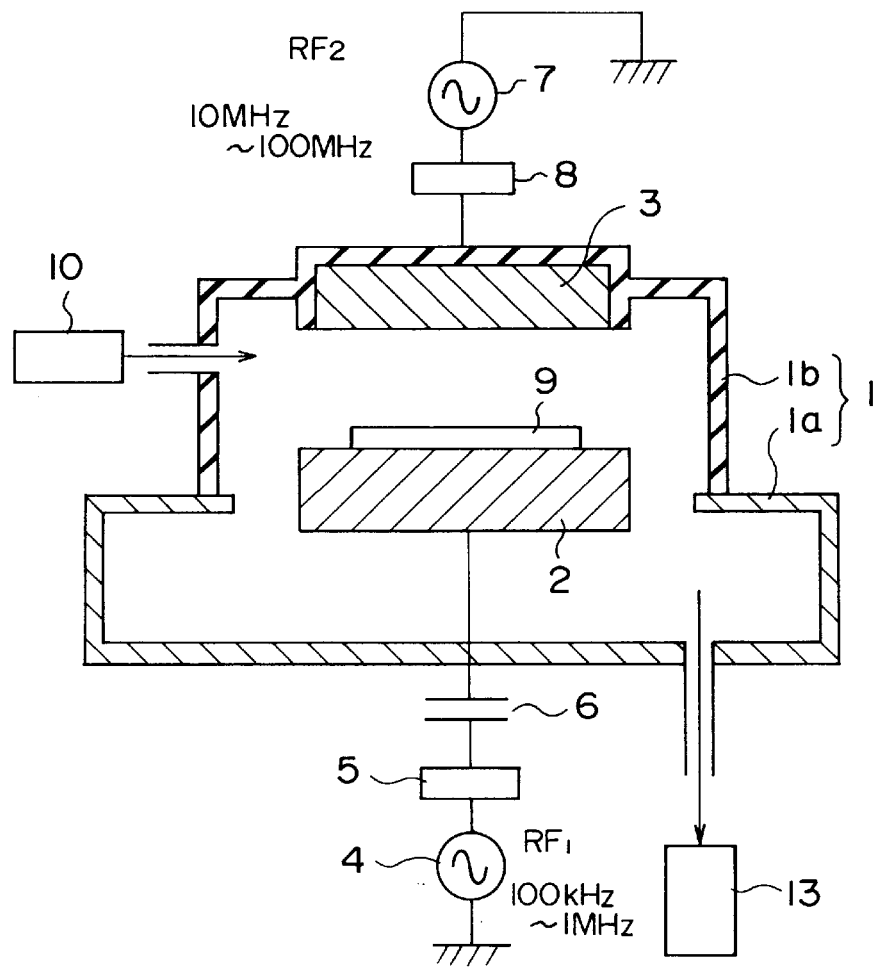
FIG.7
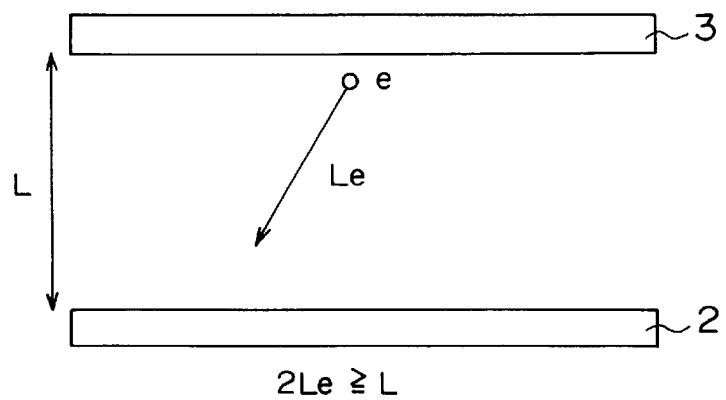

FIG.10
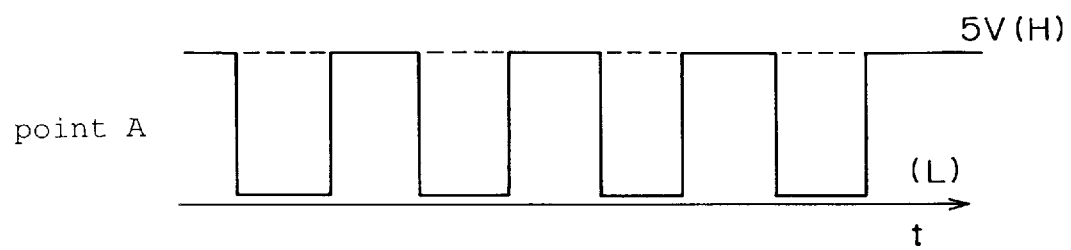
point A
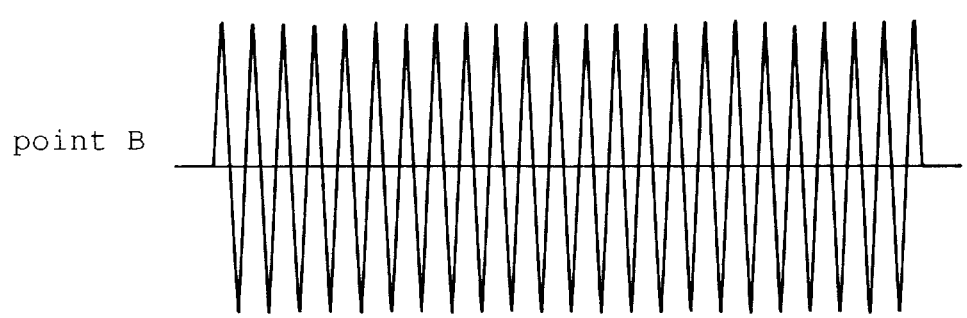
point B
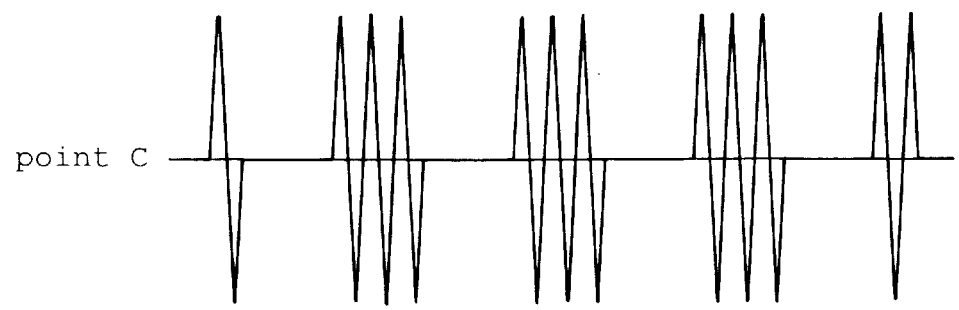
point C

PLASMA TREATMENT METHOD

BACKGROUND OF THE INVENTION

1. Field of the Invention

The present invention relates to a plasma equipment used for manufacturing CMOS semiconductor device, etc. and a plasma treatment method for effecting etching or film forming with the use of the plasma equipment and, more particularly, a plasma equipment and a plasma treatment method capable of avoiding damage to gate oxide film, etc. caused by charge-up in plasma treatment.

2. Description of the Prior Art

FIG.1 is a sectional view showing a plasma equipment in the prior art. A chamber 21 consists of a chamber main body 21a, and a bell jar 21b detachably attached to the chamber main body 21a. A substrate bias electrode 22 is arranged in the chamber 21. High frequency electric power is supplied from a high frequency power source 24 to the substrate bias electrode 22 via a filter 25 and a blocking capacitor 26. A wafer 9 is loaded on the substrate bias electrode 22.

A counter electrode 23 is arranged over the substrate bias electrode 22. The counter electrode 23 is kept at ground potential. The chamber 21 is connected to a gas supplying portion 27 consisting of a gas cylinder, a mass flow controller, and the like. Desired etching gas or film forming gas is supplied from the gas supplying portion 27 to the chamber 21. The chamber 21 is also connected to a exhaust pump 28.

FIG.2 is a sectional view showing part of semiconductor wafer in the course of plasma etching in the plasma equipment constructed as above. A pair of diffusion regions 31a, 31a serving as source and drain regions, for example, are formed in a semiconductor wafer 31. A gate electrode 33 is formed on the semiconductor wafer 31 between the pair of diffusion regions 31a, 31a via a gate oxide film 32. The gate electrode 33 is covered with an insulating film 38. An aluminum film 35 used as wirings is formed on the insulating film 38. The aluminum film 35 is connected electrically to the gate electrode 33 via a contact hole 34. On the aluminum film 35 is formed a resist 36 in which opening portions 36a are formed with a predetermined pattern. A reference 37 denotes a scribbling line area provided on the semiconductor wafer 31. The semiconductor wafer 31 is separated into a plurality of semiconductor chips by cutting off along the scrubbing line area 37 by later step.

In plasma etching, an interior of the chamber 21 is exhausted by the exhaust pump 28, then etching gas such as $CF_4$, $SF_6$, $Cl_2$, or the like is supplied from the gas supplying portion 27 to the chamber 21, and then high frequency electric power is supplied from the high frequency power source 24 to the substrate bias electrode 22 via the blocking capacitor 26. At that time, the gas is changed into plasma state in the chamber 21, and positive ions in plasma reach the aluminum film 35 through the resist opening portions 36a and etch the aluminum film 35.

In the meanwhile, upon etching, leakage current caused by potential difference between the gate electrode 33 and the semiconductor wafer 31 can flow through the gate oxide film 32. As a result, degradation in characteristics of the gate oxide film 32 can be caused, otherwise in extreme cases dielectric breakdown of the gate oxide film 32 can be caused. Such phenomenon is called charge damage.

There will be explained charge damage more detail hereinbelow. As shown in FIGS. 3 and 4, electrons e in plasma collide with the resist 36 during etching, and thus negative charges are accumulated on the resist 36. Hence, a phenomenon that electrons e in plasma are difficult to enter into the opening portions 36a of the resist 36 because of repulsion force caused by such negative electrons, i.e., a so-called electron shading effect, is generated (Jpn. J. Appl. Phys. Vol. 33 (1994), pp. 6013–6018). On the other hand, since positive ions I with large mass may reach the aluminum film 35 through the opening portions 36a of the resist, positive charges are accumulated on the aluminum film 35 and the gate electrode 33. In this event, since the scrubbing line area 37 is hardly affected by negative charges accumulated on the resist 36, positive ions I and electrons e may reach the semiconductor wafer 31 at the substantially same rate. Accordingly, large potential difference occurs between the gate electrode 33 and the semiconductor wafer 31 causing F-N injection (Fowler-Nordheim tunneling injection), so that leakage current L flows through the gate oxide film 32. As a result, deterioration or destruction of the gate oxide film 32 is caused.

FIG. 5 is a graph illustrative of a relationship between difference in self-bias voltage between hole pattern and open-space pattern and RF bias voltage when the aspect ratios are 2, 4.4, and 8 respectively, wherein an abscissa denotes high frequency bias voltage value Vp-p applied to the semiconductor wafer (Si) while an ordinate denotes difference in self-bias voltage.

Hole patterns or open-space patterns are formed by processing the $SiO_2$ film. The frequency of high frequency (RF) power source is 400 kHz. As evident from FIG. 5, if the voltage of the high frequency power source is relatively high, relatively large voltage difference such as about 95 V appears between the hole pattern at aspect ratio of 2 and the open-space pattern due to the electron shading effect. The aspect ratio is defined as ratio of a height of the resist opening portion to a width of the resist opening portion.

The electron shading effect caused by the resist is enhanced much more as the aspect ratio is increased. Thus, even if a plurality of hole patterns with different aspect ratios are formed on the semiconductor wafer, an amount of charge accumulated in the conductive film, etc. beneath respective hole patterns differ from each other. It is probable that, due to difference in the amount of charge, leakage current flows through a thin insulating film formed on a surface of the semiconductor wafer, thus damaging the insulating film.

Charge damage is easy to occur during etching step for forming opening portions having large aspect ratio to form wirings, etching step for via holes, plasma cleaning step for via holes, plasma CVD step, etc. Because of local charge-up in the insulating film, such disadvantages occur that pattern profiles distorted in patterning, etching rate is varied depending on the aspect ratio, and the like.

As appreciated from FIG. 5, if the high frequency bias voltage value Vp-p exceeds more than about 200 V, values of self-bias voltage become different in compliance with the aspect ratio and as a result there is a possibility of flowing leakage current between conductive films beneath hole patterns which have different aspect ratios.

The aforementioned electron shading effect is enhanced further more if the temperature of electrons in plasma becomes higher. The reason for the above would be considered as that electrons are easily accumulated on the resist to increase potential on the side walls of the resist as the temperature of electrons becomes higher.

Ordinarily, gas such as $CF_4$, $SF_6$, $Cl_2$, HBr, or the like is used in plasma process. However, these gases are apt to generate negative ions if electrons adhere to molecules of such gases, so they are called electrically negative gas. If these gases are employed, the temperature of electron is inevitably increased since a rate of electron density to plasma density is low. Accordingly, in the plasma process using these gases, charge damage due to the electron shading effect is prone to occur.

In the plasma equipment, if frequency or voltage of high frequency electric power supplied to the substrate bias electrode is excessively high, the temperature of electron in plasma is increased to cause easily charge damage due to the electron shading effect.

In the prior art, in order to prevent charge damage, power of the high frequency power source applied to plasma is lowered to reduce plasma density. The electron shading effect is thus lessened, so that charge damage can be suppressed.

However, charge damage can be avoided by lowering power of the high frequency power source applied to plasma, but such a problem arises that etching rate is also reduced.

In Patent Application Publication (KOKAI) 57-131374, the plasma etching equipment has been disclosed wherein high frequency voltage is supplied to the cathode electrode on which the semiconductor wafer is loaded whereas higher frequency voltage than the high frequency voltage supplied to the cathode electrode is supplied to the. anode electrode which opposes to the cathode electrode. However, this plasma etching equipment has been intended to increase etching rate by controlling independently current density of ion reaching the semiconductor wafer and ion energy incident into the semiconductor wafer. In this plasma etching equipment, no countermeasure as with charge damage has been considered.

In Patent Application Publication (KOKAI) 2-312231, the plasma etching equipment has been disclosed wherein high frequency electric power is supplied to the cathode electrode on which the semiconductor wafer is loaded whereas high frequency electric power having lower frequency than that of the high frequency electric power supplied to the cathode electrode is supplied to the anode electrode which opposes to the cathode electrode. However, in this plasma etching equipment, the frequency of bias power source for the anode electrode is set lower than that of bias power source for the cathode electrode. In addition, since the magnetic field is formed vertically to the wafer near the substrate in this equipment, a substantial mean free path of electron is lowered significantly. Therefore, charge-up suppressing effect caused by the counter electrode can hardly be expected.

In Patent Application Publication (KOKAI) 3-74844, the plasma etching equipment has been also disclosed wherein high frequency electric power is supplied to the cathode electrode on which the semiconductor wafer is loaded whereas high frequency electric power having lower frequency than that of the high frequency electric power supplied to the cathode electrode is supplied to the anode electrode which opposes to the cathode electrode. However, two power sources have not been used simultaneously in this plasma etching equipment. Moreover, the frequency of bias power source for the anode electrode is set lower than that of bias power source for the cathode electrode. Further, since operating pressure is high like 1 torr, charge-up suppressing effect caused by the counter electrode can seldom be expected.

In Patent Application Publication (KOKAI) 5-62935, the plasma etching equipment has been disclosed wherein high frequency electric power is supplied to the cathode electrode on which the semiconductor wafer is loaded to accelerate ions whereas high frequency electric power is supplied to the electrodes around the cathode electrode to generate plasma. However, in this plasma etching equipment, high frequency electric power to accelerate electrons has not been supplied to the electrode opposing to the cathode electrode. In addition, in this equipment, since the magnetic field is formed near the substrate, a substantial mean free path of electron is reduced significantly. Thus, charge-up suppressing effect caused by the counter electrode can scarcely be expected.

SUMMARY OF THE INVENTION

An object of the present invention is to provide a plasma equipment and a plasma treatment method capable of reducing electron shading effect and also suppressing charge without affecting various characteristics in plasma process.

According to an aspect of the present invention, a first and second electrodes are arranged to oppose to each other, and high frequency electric power of 100 kHz to 1 MHz, for example, is supplied to the first electrode to generate plasma in a chamber. High frequency electric power of 10 MHz to 40 MHz, for example, is supplied to the second electrode. It is preferable that frequency of high frequency electric power supplied to the second electrode is as high as possible, so it may be set in the range of 10 MHz to 100 MHz. By plasma sheath electric field which is generated by high frequency electric power supplied to the second electrode, electrons near the second electrode are accelerated toward the first electrode. Thereby, velocity component of electrons in plasma toward the first electrode is increased, so that electrons reach bottoms of openings in the resist. For this reason, positive charges are neutralized with electrons to thus suppress charge-up.

In this event, electrons which are accelerated by high frequency electric power supplied to the second electrode collide with the gas in the course of travelling toward the first electrode, so that velocity component of electrons in the direction toward the first electrode is decreased. If a distance between the first electrode and the second electrode exceeds two times of a mean free path of electron, velocity component of electrons in the direction toward the first electrode is significantly reduced. As a result, the number of electron reaching the bottoms of the openings in the resist is lessened, whereby sufficient charge-up preventing effect cannot be achieved. For this reason, a distance between the first electrode and the second electrode is set less than two times as long as a mean free path of electron. The mean free path of electron is associated with kinds of gas and pressure thereof. The smaller the pressure, the larger the mean free path. In case pressure of gas is less than about 10 mTorr, the mean free path becomes several tens mm. In the case of $Cl_2$ gas used for etching the aluminum film, for example, the mean free path of electron is given as about 50 mm if pressure of gas is 3 mTorr. In the case of the conventional parallel plate type plasma equipment, about 50 mTorr is a lower limit value of pressure and at that time the mean free path of electron is less than about 3 mm.

According to another aspect of the present invention, high frequency electric power of the first frequency is supplied to the first electrode on which the semiconductor wafer is loaded while high frequency electric power of the second frequency being higher than that of the high frequency electric power supplied to the first electrode is supplied to the second electrode which opposes to the first electrode.

High frequency inductive ( having magnetic components and electric components ) field is generated in the chamber by supplying high frequency electric power of the third frequency to the coil to generate plasma in the chamber. As a result of the above, ions in plasma reach the semiconductor wafer in a period when the first electrode acts as the cathode, and then electrons reach the semiconductor wafer in a period when the first electrode acts as anode and the second electrode is in a negative period. Therefore, positive charges are neutralized with electrons to thus permit charge damage to be avoided.

Instead of generating plasma in the chamber by supplying high frequency electric power to the coil, plasma may be generated in the chamber by microwave power transmitted into the chamber. If the first and second high frequency electric powers are supplied simultaneously to the first electrode while the second electrode is kept at a constant potential, the same effect as above can be obtained. However, in this case, it is preferable that the thick insulating film is formed on the inner side wall of the chamber to reduce electric coupling between plasma and inner side wall of the chamber.

BRIEF DESCRIPTION OF THE DRAWINGS

FIG. 6 is a schematic sectional view showing a plasma equipment according to a first embodiment of the present invention;

FIG. 7 is a view illustrating a relationship between a distance between a substrate bias electrode and a counter electrode and a mean free path of electron;

FIG. 10 is a waveform chart showing waveforms at points A, B, and C in FIG. 9;

DESCRIPTION OF THE PREFERRED EMBODIMENTS

Figure 1:
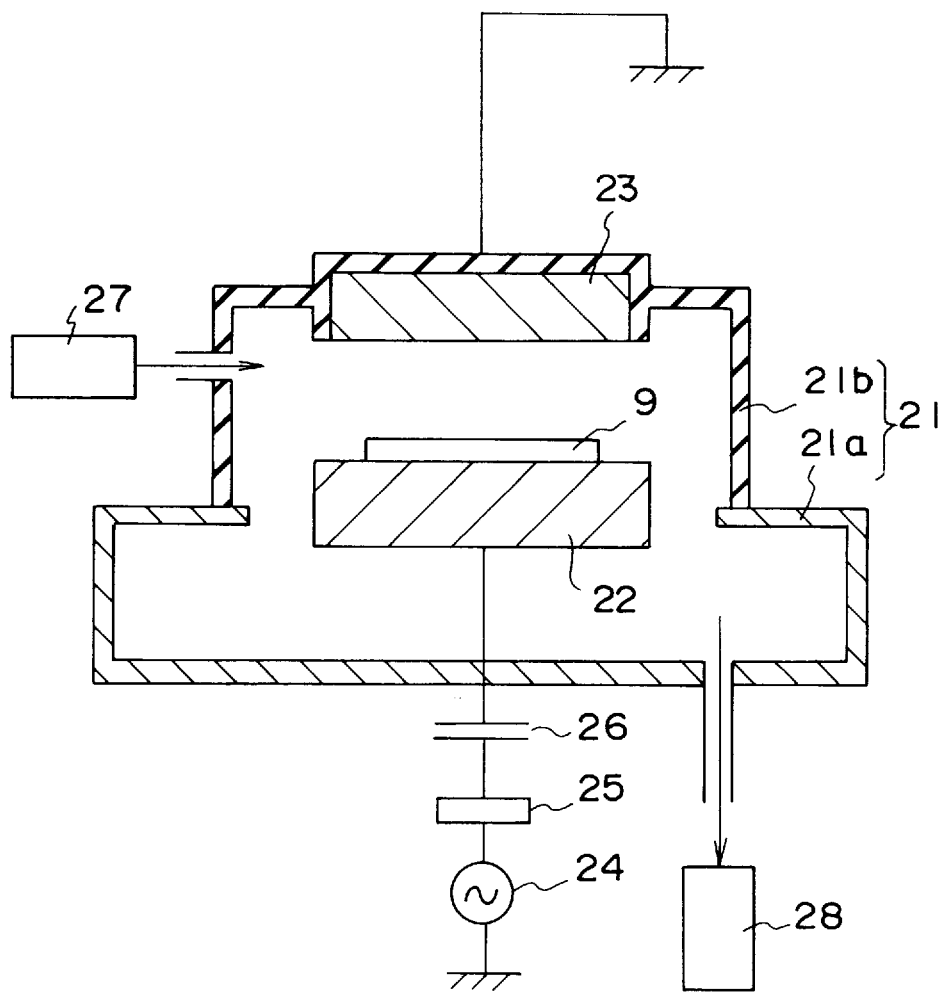
FIG. 1 is a sectional view showing a plasma equipment in the prior art.

There will be explained preferred embodiments of the present invention with reference to accompanying drawings hereinafter.

(First Embodiment)

FIG. 6 is a schematic sectional view showing a plasma equipment according to a first embodiment of the present invention. A chamber 1 is composed of a chamber main body 1a, and a bell jar 1b detachably attached to the chamber main body 1a. A substrate bias electrode 2 is arranged in the chamber 1. A semiconductor wafer 9 is loaded on the substrate bias electrode 2. High frequency electric power of frequency $RF_1$ is supplied from a high frequency power source 4 to the substrate bias electrode 2 via a filter 5 and a blocking capacitor 6. The frequency $RF_1$ is set in the range of 100 kHz to 1 MHz. A counter electrode 3 is arranged over the substrate bias electrode 2 so as to oppose to the substrate bias electrode 2. High frequency electric power of frequency $RF_2$ is supplied from a high frequency power source 7 to the counter electrode 3 via a filter 8. The frequency $RF_2$ is set in the range of 10 MHz to 100 MHz. The chamber 1 is connected to a gas supplying portion 10 consisting of a gas cylinder, a mass flow controller, and the like. Desired etching gas or film forming gas is supplied at a preselected flow rate from the gas supplying portion 10 to the chamber 1. Further, the chamber 1 is connected to an exhaust pump 13.

In the first embodiment, as shown in FIG. 7, a distance L between the substrate bias electrode 2 and the counter electrode 3 is less than two times as large as a mean free path Le of electron e ($2Le \geq L$). For instance, if $Cl_2$ is used as etching gas and gas pressure in the chamber 1 is 3 mTorr, the distance L between the substrate bias electrode 2 and the counter electrode 3 is set less than 100 mm because the mean free path Le of electron e is about 50 mm.

Prior to explanation about the operation of the plasma equipment according to the first embodiment, it will be explained that the reason why the distance between the substrate bias electrode 2 and the counter electrode 3 is set less than two times as long as the mean free path of electron.

Figure 12:
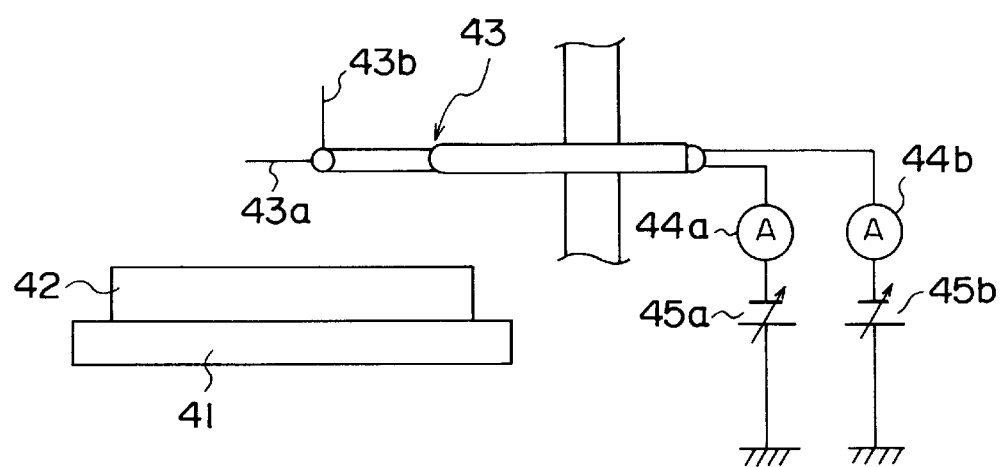
FIG. 12 is a schematic view showing a method of measuring the temperature of electron in plasma by a Langmuir Probe method.

In order to examine a relationship between charge damage and electron temperature during plasma process, charge damaged portions have been examined by etching aluminum wirings of CMOS with the use of the ECR (Electron Cyclotron Resonance) plasma etching equipment, and electron temperature in plasma over the semiconductor wafer has been measured by Langmuir Probe method. FIG. 12 is a schematic view showing a method of measuring electron temperature in plasma by Langmuir Probe method.

A semiconductor wafer 42 is loaded on a substrate bias electrode 41, and a Langmuir Probe 43 is arranged over the semiconductor wafer 42, i.e., is arranged 40 mm over from an electrode 41. The Langmuir Probe 43 comprises a stylus-like probe 43a arranged in parallel to a surface of the semiconductor wafer 42, and a stylus-like probe 43b arranged perpendicular to the surface of the semiconductor wafer 42. The probe 43a is used for measuring electron temperature in the direction parallel to the surface of the semiconductor wafer 42, while the probe 43b is used for measuring electron temperature in the direction perpendicular to the surface of the semiconductor wafer 42. Predetermined voltages are applied from power sources 45a, 45b to these probes 43a, 43b via ampere meters 44a, 44b. By measuring currents flowing through the ampere meters 44a, 44b, electron temperature of plasma in both directions parallel to and perpendicular to the surface of the semiconductor wafer 42 can be detected.

Figure 2:
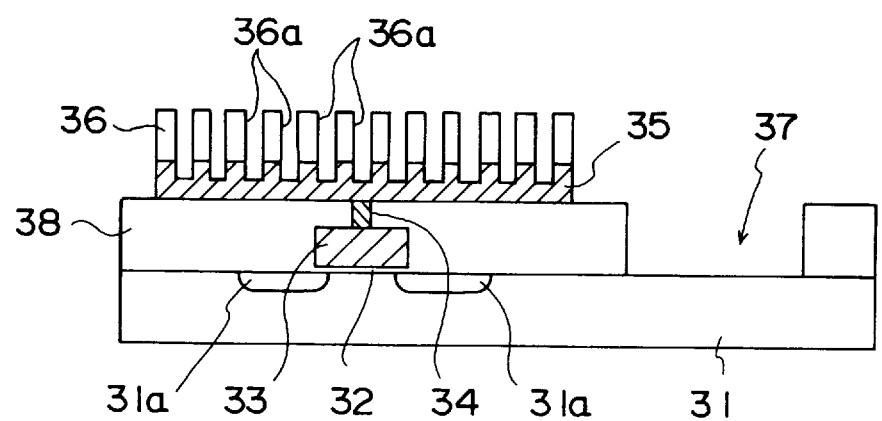
FIG. 2 is a sectional view showing part of semiconductor wafer in the course of plasma etching in the plasma equipment.
Figure 3:
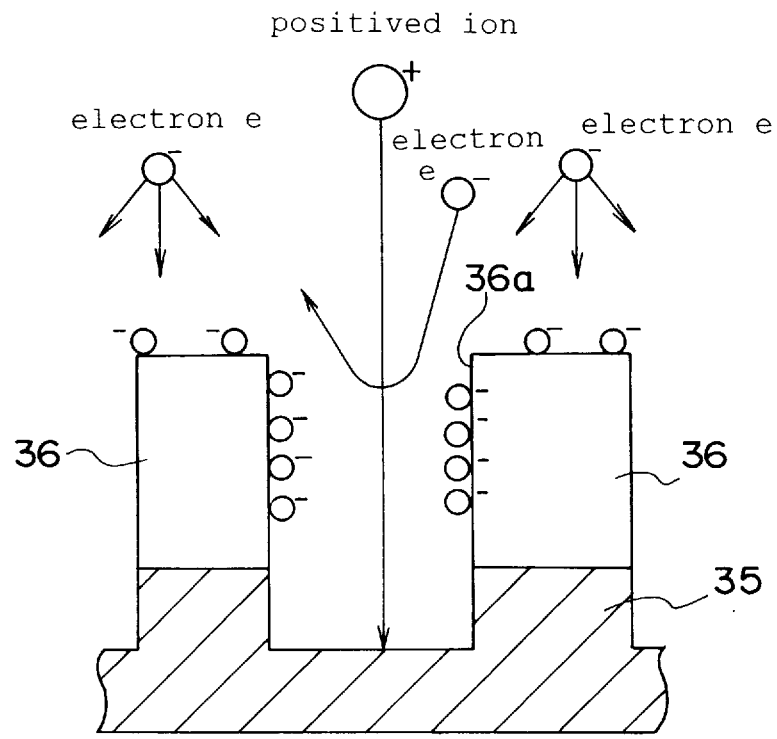
FIG. 3 is a schematic illustration of electron shading effect.
Figure 4:
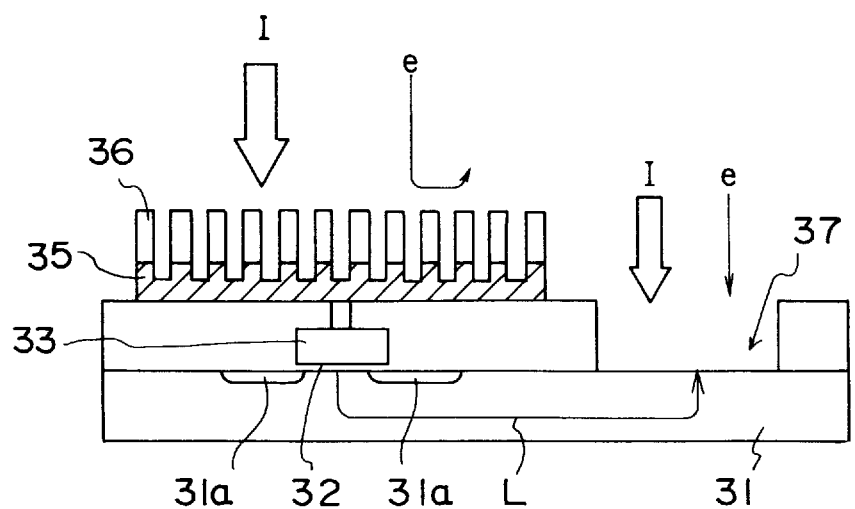
FIG. 4 is a schematic illustration of generation of charge damage.
Figure 5:
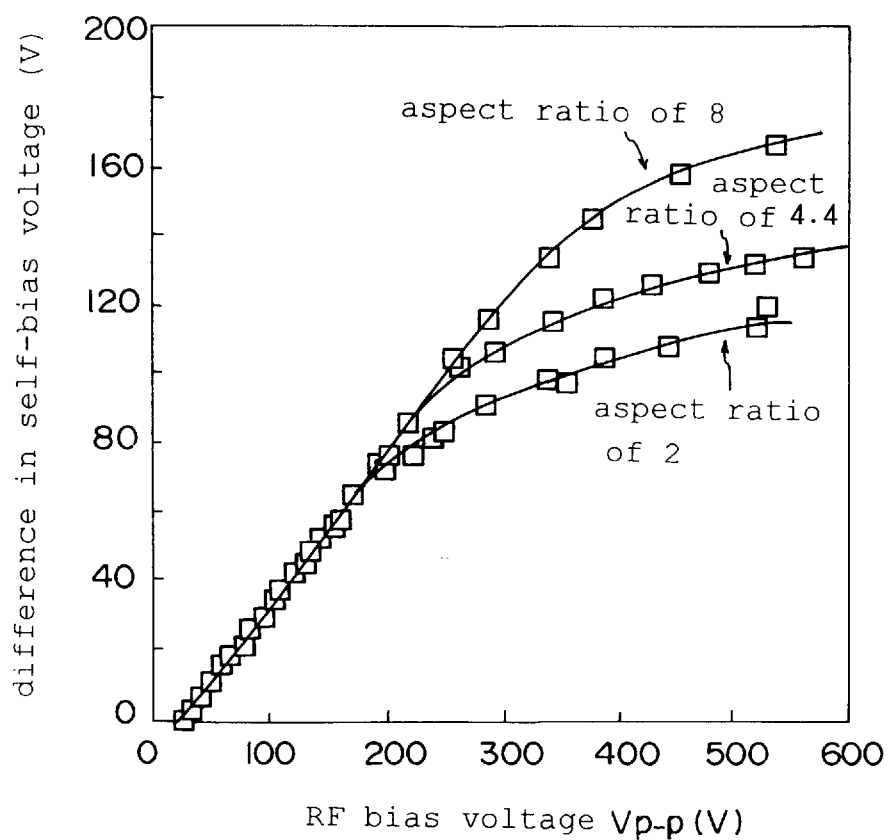
FIG. 5 is a graph illustrative of a relationship between difference in self-bias voltage and RF bias voltage where the aspect ratio is different.

A plurality of gate electrodes are aligned on the semiconductor wafer 42 via a gate oxide film of 8 nm thick (see FIG. 2). Each gate electrode is a square having a side of 1 $\mu$m. These gate electrodes are covered with an insulating film, and an aluminum film of 0.8 $\mu$m thick is formed on the insulating film. The aluminum film is electrically connected to the gate electrode via contact holes formed selectively in the insulating film. An antenna ratio, i.e., a ratio of an area of the gate electrode to an area of the aluminum film, is on the order of 104 to 106. A photoresist pattern of 1.6 $\mu$m thick is formed on the aluminum film.

While effecting plasma etching, with the use of mixed gas of $Cl_2$ and $BCl_3$, under the condition where pressure is 4.5 mTorr, power of microwave is 800 W, and power of high frequency electric power supplied to the substrate bias electrode is 150 W and while moving the Langmuir Probe 43 horizontally to the surface of the semiconductor wafer, a relationship between electron temperature and damage has been examined.

Figure 13:
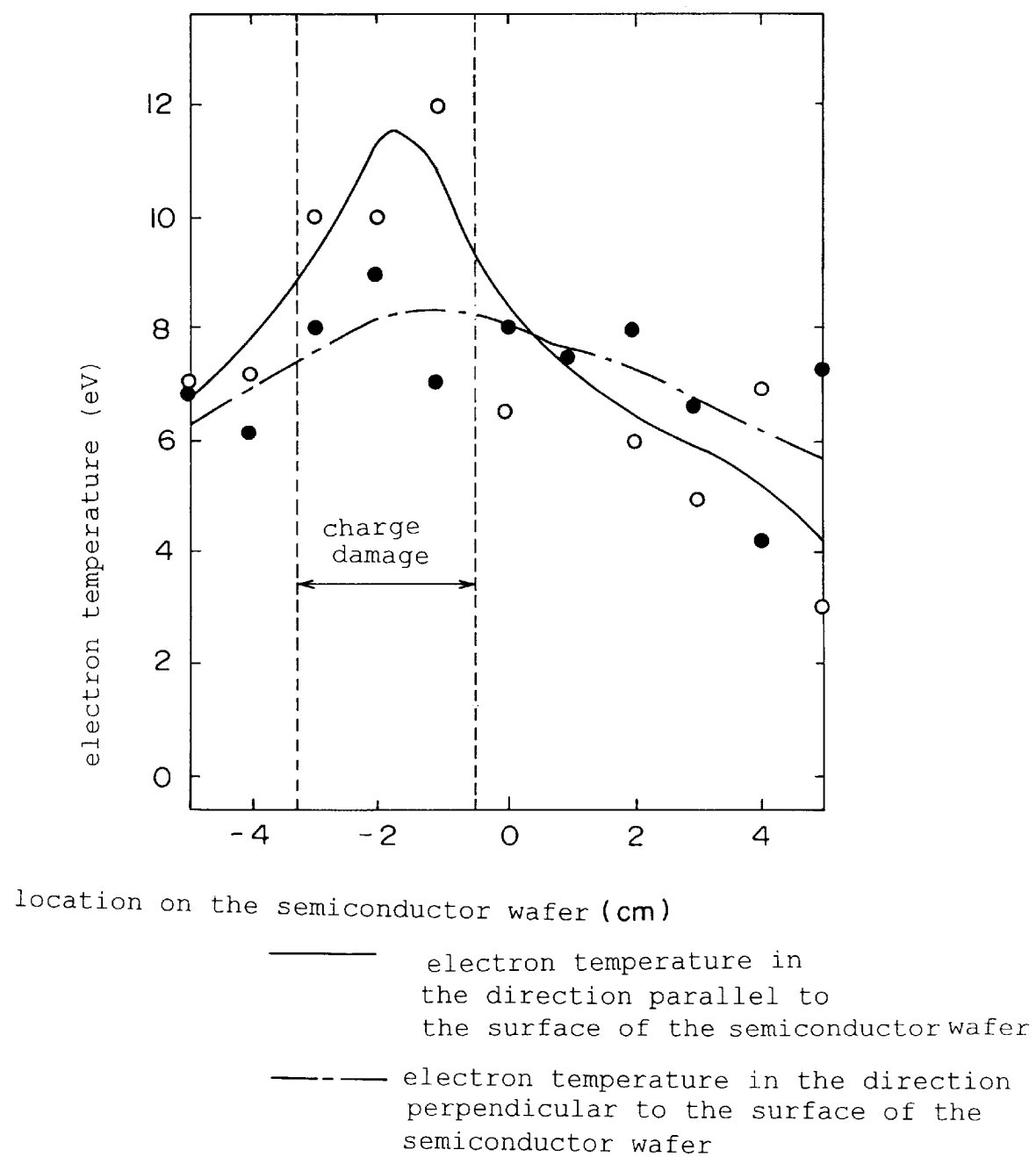
FIG. 13 is a graph illustrative of a relationship between electron temperature and charge damage.

FIG. 13 is a graph illustrative of a relationship between electron temperature and charge damage, wherein an abscissa denotes location (relative location) on the semiconductor wafer while an ordinate denotes electron temperature. It can be understood from FIG. 13 that charge damage is enhanced in the range where the electron temperature in the direction parallel to the surface of the semiconductor wafer exceeds the electron temperature in the direction perpendicular to the surface of the semiconductor wafer. This is because the electron shading effect would be increased since potential on the side walls of the pattern is caused to increase negatively if the electron-temperature in the direction parallel to the surface of the semiconductor wafer is high. Conversely, the electron shading effect would be decreased since electrons incident into the bottoms of the pattern opening portions are increased if the electron temperature in the direction perpendicular to the surface of the semiconductor wafer is high.

Figure 14A:
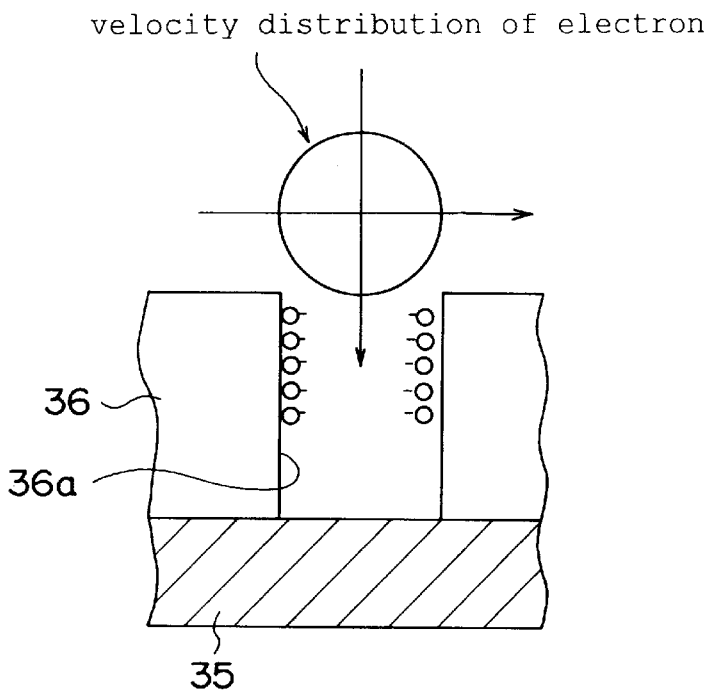
FIG. 14A is a diagrammatic illustration of electrons having isotropic velocity distribution.
Figure 14B:
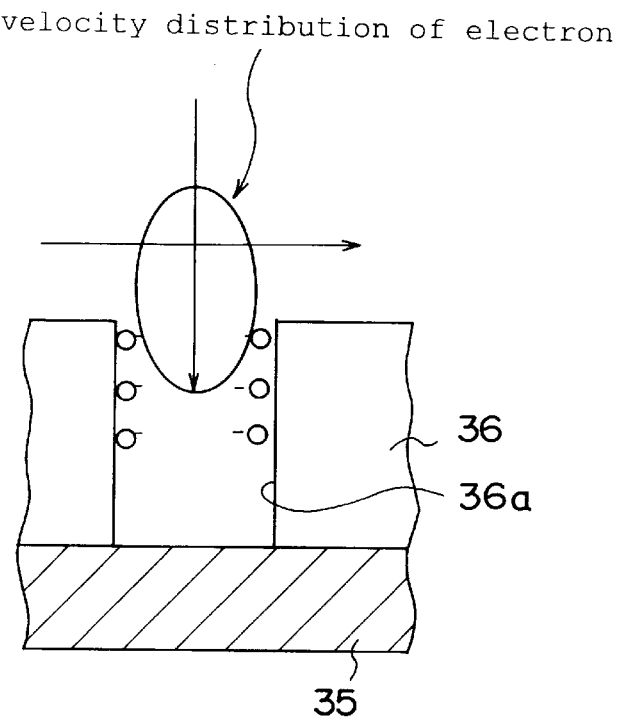
FIG. 14B is a diagrammatic illustration of electrons having anisotropic velocity distribution with larger component toward of semiconductor wafer.

From these results, the inventors of the present invention have found that it is effective in reducing the electron shading effect in the plasma equipment to provide anisotropy to the electron temperature. In other words, by providing anisotropic velocity distribution to electrons with large component in the direction toward the semiconductor wafer, as shown in FIG. 14B like a diagrammatic illustration, instead of providing isotropic velocity component distribution of electrons, as shown in FIG. 14A like diagrammatic illustration, charge-up on the side wall of the resist can be reduced relatively. The present invention intends to suppress charge damage by providing larger anisotropy of the electron temperature to electrons in the direction toward the semiconductor wafer.

Figure 15:
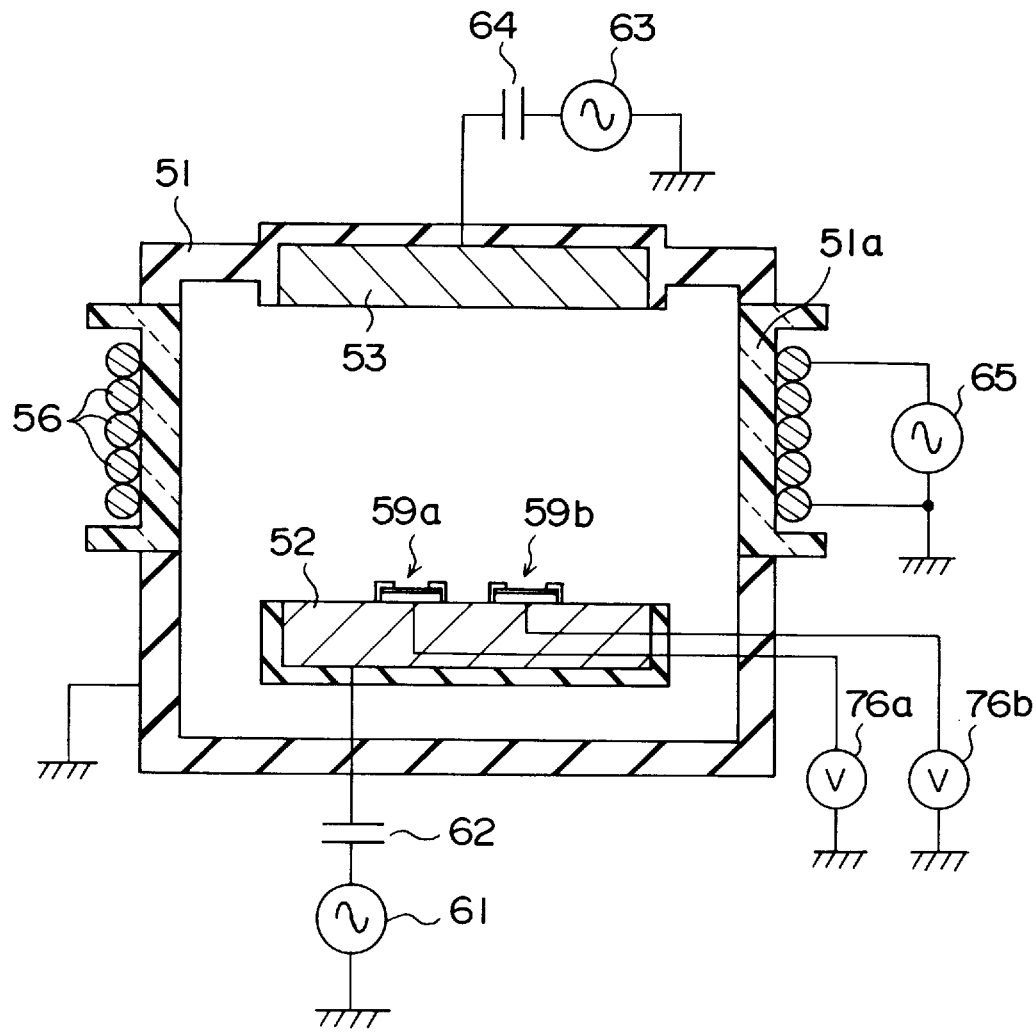
FIG. 15 is a sectional view showing a plasma equipment used to examine a relationship between a mean free path of electron and charge-up.

In case the distance between the first and second electrodes is set one to four times as long as the mean free path of electron, the results of examination as with reduction degree of charge-up will be explained hereinbelow. FIG. 15 is a sectional view showing a plasma equipment used in examination. However, the gas supplying portion and the exhaust pump are omitted in FIG. 15. A chamber 51 has a bell jar 51a formed of cylindrical glass, and other portions of the chamber 51 is formed of aluminum or aluminum alloy. Metal portions of the chamber 51 is connected to ground. The bell jar 51a is of 500 mm diameter, 5 mm thick, and 200 mm height. A first electrode 52 is arranged in the chamber 51, and samples 59a, 59b described later are loaded on the first electrode 52. High frequency electric power of 400 kHz is supplied from a high frequency power source 61 to the first electrode 52 via a capacitor 62. A second electrode 53 is arranged over the first electrode 52. High frequency electric power of 13.56 MHz is supplied from a high frequency power source 63 to the second electrode 53 via a capacitor 64. A coil 56 is wound around outer periphery of the bell jar 51a, and high frequency electric power is supplied from a high frequency power source 65 to the coil 56. High frequency magnetic field is generated by the coil 56 in the chamber 51. Gas in the chamber 51 is excited by the high frequency inductive field to thus generate plasma.

Figure 16:
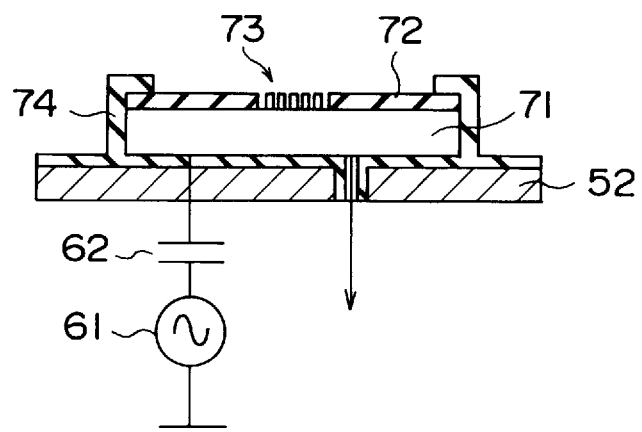
FIG. 16 is a sectional view showing a sample used to examine a relationship between a mean free path of electron and charge-up.

As shown in FIG. 16, as a sample 59a, an $SiO_2$ film 72 which is formed on a silicon substrate 71 to have a thickness of about 2 $\mu$m and in which a hole pattern 73 consisting of a plurality of holes having a diameter of 1 $\mu$m is formed is prepared. As a sample 59b, the $SiO_2$ film in which sufficiently large open-space is formed in place of the hole pattern is prepared. These samples 59a, 59b are secured to the first electrode 52 by an $Al_2O_3$ holder 74. The sample 59a, 59b are connected to voltmeters 76a, 76b respectively.

Argon (Ar) gas is introduced into the chamber 51. While mean free path of electron is varied by changing pressure in the chamber 51 from 2.5 mTorr to 10 mTorr, charging voltage of the samples are measured by the voltmeters 76a, 76b when the distance between the electrodes 52, 53 is set one to four times as long as the mean free path of electron. As other measuring conditions, plasma density is 2 to $3 \times 10^{10}$ cm$^{-3}$, voltage Vp-p applied to the first electrode 52 is 400 V, and voltage Vp-p applied to the second electrode 53 is 600 V.

Figure 17A:
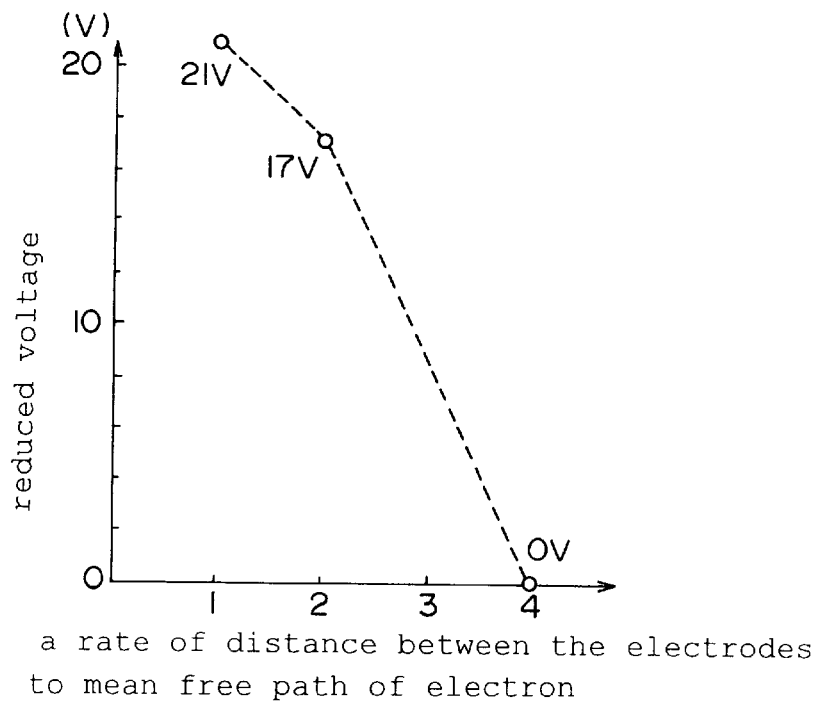
FIG. 17A is a graph illustrative of a relationship between a distance between electrodes and reduced voltage for charge-up.

FIG. 17A is a graph illustrative of a relationship between a distance between electrodes and reduced voltage for charge-up, wherein an abscissa denotes a rate of distance between the electrodes to mean free path of electron while an ordinate denotes reduced voltage. However, charging voltage is 100 V unless high frequency electric power is supplied to the second electrode 53. As apparent from FIG. 17A, an effect of reducing the charging voltage does not appear if the distance between the electrodes 52, 53 is set four times as long as the mean free path of electron, but charging voltage is reduced by 17 V or more if the distance between the electrodes 52, 53 is set less than two times as long as the mean free path of electron.

From these results of examination, the distance between the electrodes 2, 3 is set less than two times as long as the mean free path of electron in the plasma equipment shown in FIG. 6.

In the plasma equipment shown in FIG. 6, in case aluminum film formed on the semiconductor wafer 9 on which a wiring aluminum film 35 and a resist 36 are formed, as shown in FIG. 2, is etched, an inside of the chamber 1 is exhausted by an exhaust pump 13, and then $Cl_2$ gas, for example, is supplied as etching gas to the chamber 1 from the gas supplying portion 10. Pressure in the chamber 1 is kept at about 3 mTorr. High frequency electric power of 100 kHz to 1 MHz is supplied from the high frequency power source 4 to the substrate bias electrode 2, while high frequency electric power of 10 MHz to 100 MHz is supplied from the high frequency power source 7 to the counter electrode 3. At that time, plasma is generated in the chamber 1, and ions in plasma reach the aluminum film 35 through the resist opening portions 36a on the semiconductor wafer 9 to thus etch the aluminum film 35.

On the counter electrode 3 side, electrons in plasma are accelerated toward the substrate bias electrode 2 side by high frequency electric power supplied to the counter electrode 3. The electrons collide with the gas until they reach the semiconductor wafer 9 and as a result anisotropy of electron temperature is attenuated. However, in the first embodiment, since the distance between the substrate bias electrode 2 and the counter electrode 3 is set less than two times as long as the mean free path of electron, electrons reach the bottom of the opening portions through the opening portions in the resist with keeping sufficient anisotropy of electron temperature, as shown in diagrammatic illustration of FIG. 14B. Hence, positive charges accumulated on the aluminum film 35 and the gate electrode are neutralized with such electrons so that charge damage can be avoided.

The results of examination as to a relationship between applied voltages to the substrate bias electrode and the counter electrode and charge-up suppressing effect will be explained hereinbelow. In examination, the plasma equipment shown in FIG. 15 has been used. A sample 59a is prepared wherein first the $SiO_2$ film of about 2.0 $\mu$m thick is formed on the silicon substrate and then a hole pattern consisting of a plurality of holes with an aspect ratio of 2. A sample 59b is prepared wherein sufficiently large open-space is formed in the $SiO_2$ film in place of the hole pattern.

Ar (argon) gas is introduced into the chamber 51, and the pressure in the chamber 51 is kept at 2.5 mTorr. High frequency electric power of the frequency 400 kHz is supplied to the first electrode 52. Simultaneously, high frequency electric power of the frequency 13.56 MHz is supplied to the second electrode 53 to generate high energy electrons in plasma. High frequency electric power of the frequency 3.4 MHz and power 1.5 kW is also supplied to the coil 56. Thus, plasma is generated in the chamber. Density of plasma is $1 \times 10^{11}$ cm$^{-3}$ and electron temperature is 4 eV. The distance between the first electrode 52 and the second electrode 53 is 160 mm, which is substantially identical to the mean free path of electron.

Figure 18:
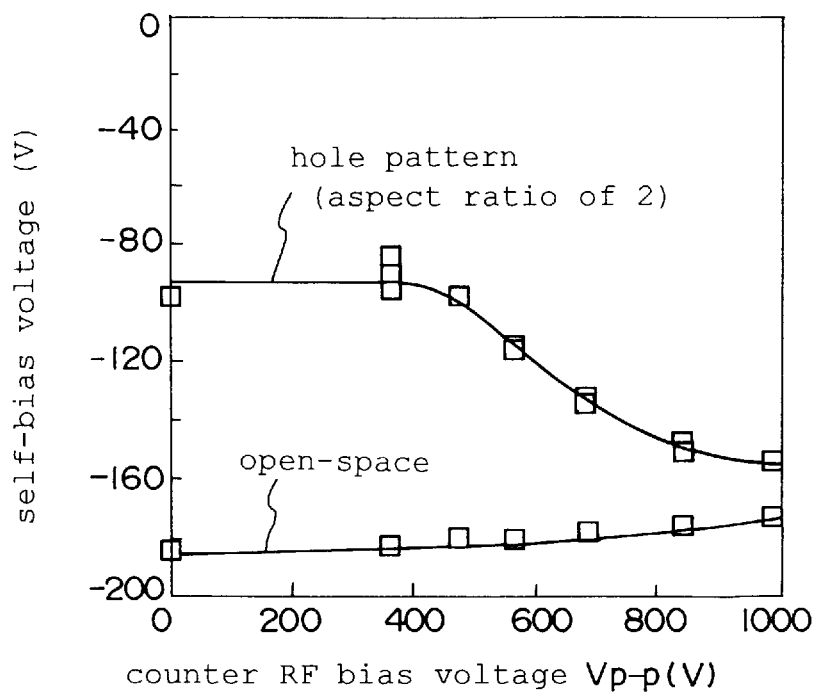
FIG. 18 is a graph illustrative of a relationship between self-bias voltage and RF bias voltage in hole patterns having an aspect ratio of 2 and open-space.
Figure 19:
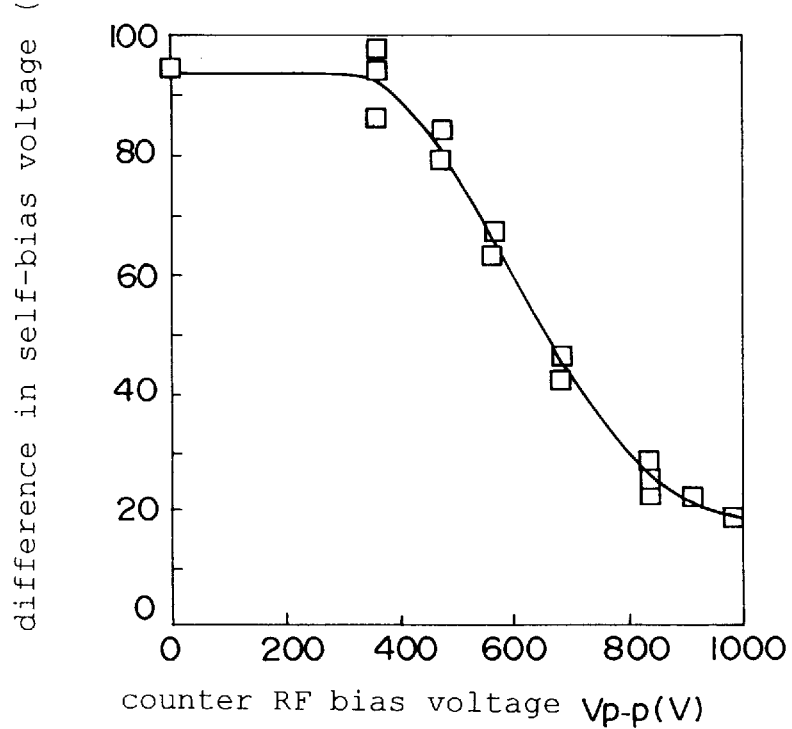
FIG. 19 is a graph illustrative of a relationship between difference in self-bias voltage and RF bias voltage in hole pattern having an aspect ratio of 2 and open-space.

With high frequency voltage Vp-p applied to the first electrode 52 to 400 V, and changing the high frequency voltage Vp-p applied to the second electrode 52, self-bias voltage of the sample having the hole pattern with the aspect ratio of 2 and the sample having the open-space have been examined. FIG. 18 is a graph illustrative of a relationship between self-bias voltage and RF bias voltage. In the case of the sample having the hole pattern, the self-bias voltage is decreased as the counter bias voltage is increased. However, the sample having the open-space pattern, the self-bias voltage is increased slightly. FIG. 19 is a graph illustrative of relationship between difference in self-bias voltage and RF bias voltage in the hole pattern with the aspect ratio of 2 and the open-space pattern. In this case, the self-bias voltage is deceased as the counter bias voltage is increased and charge damage can be prevented.

Figure 17B:
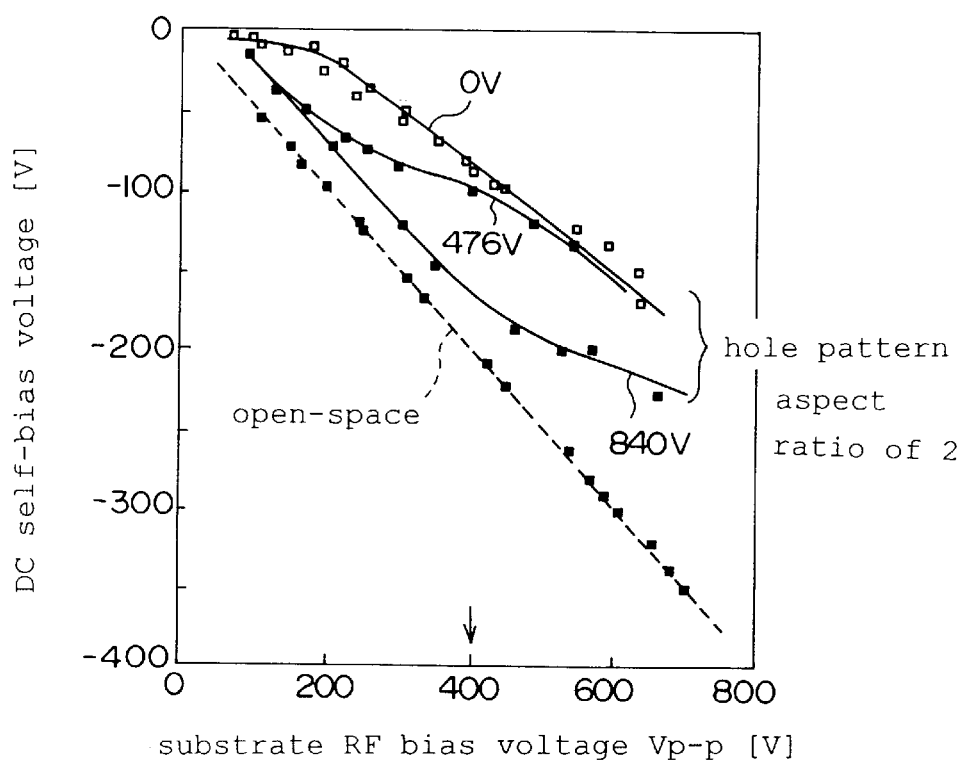
FIG. 17B is a graph illustrative of a relationship between substrate RF bias voltage and self-bias voltage.

With changing the high frequency voltage Vp-p applied to the second electrode 53 to 0 V, 476 V, and 840 V respectively and changing the high frequency voltage Vp-p applied to the first electrode 52 from 100 V to 900 V, self-bias voltages of the sample having the hole pattern and the sample having the open-space have been examined. FIG. 17B is a graph illustrative of a relationship between substrate RF bias voltage and self-bias voltage, wherein an abscissa denotes the substrate RF bias voltage while an ordinate denotes the self-bias voltage. In the case of the sample having the hole pattern, it can be understood from FIG. 17B that charge-up suppressing effect is reduced as the substrate RF bias voltage is increased. This is because, if the substrate RF bias voltage is increased, electron shading effect is enhanced. If the voltage supplied to the second electrode 53 is increased, the charge-up suppressing effect still appears even if the voltage supplied to the sample is high. This is because the higher the voltage applied to the second electrode 53, the higher the electron energy toward the substrate. From these experimental results, it can be seen that, if the voltage applied to the first electrode 52 is high, the voltage applied to the second electrode 53 should be increased.

It is preferable that frequency of the voltage supplied to the counter electrode 3 is set to be an integral multiple of that of the voltage supplied to the substrate bias electrode 2.

Also, it is preferable that phase of high frequency electric power output to the counter electrode 3 from that to the substrate electrode 2 can be controlled. This is because, as shown in following fourth embodiment, as changing phase of high frequency electric power output to the counter electrode 3 from that to the substrate electrode 2, the reducing charge build-up effect varied.

Figure 8A:
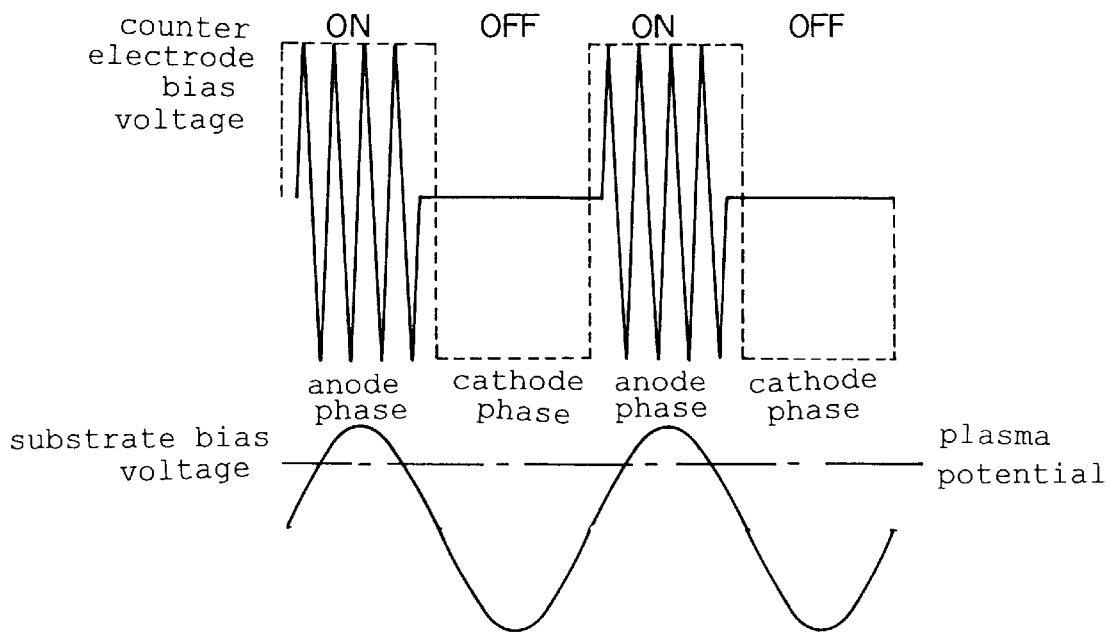
FIG. 8A is a waveform chart showing an example of waveforms of high frequency electric power supplied to the substrate bias electrode and the counter electrode.
Figure 8B:
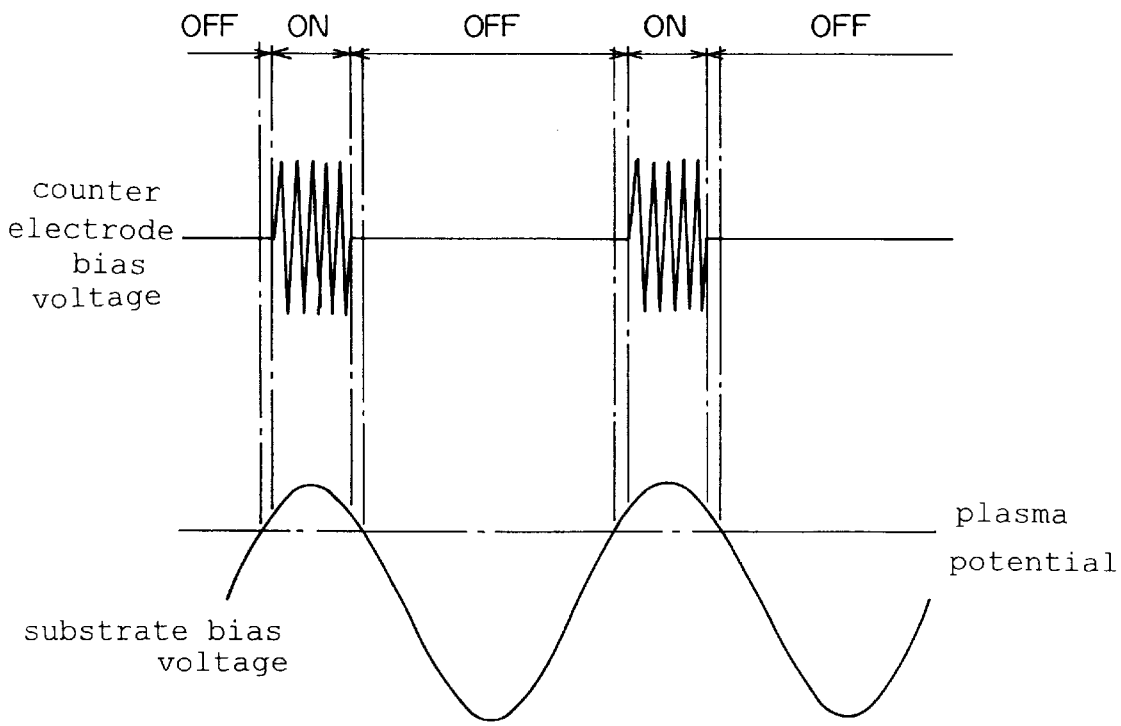
FIG. 8B is a waveform chart showing another example of waveforms of high frequency electric power supplied to the substrate bias electrode and the counter electrode.

As shown in waveform charts of FIGS. 8A and 8B, an output of the second high frequency power source 7 is desired to be controlled such that high frequency electric power is supplied to the counter electrode 3 while the substrate bias electrode 2 is acting as an anode, i.e., it is in a positive period against plasma space potential, whereas high frequency electric power is not supplied to the counter electrode 3 while the substrate bias electrode 2 is acting as a cathode, i.e., it is in a negative period against plasma space potential. Electrons enter into the opening portions in the resist when the substrate bias electrode 2 is serving as an anode, and therefore, with suppressing increase in electron temperature in plasma, electrons can be rendered to enter into the opening portions in the resist by controlling the output of the second high frequency power source 7 as above.

Figure 9:
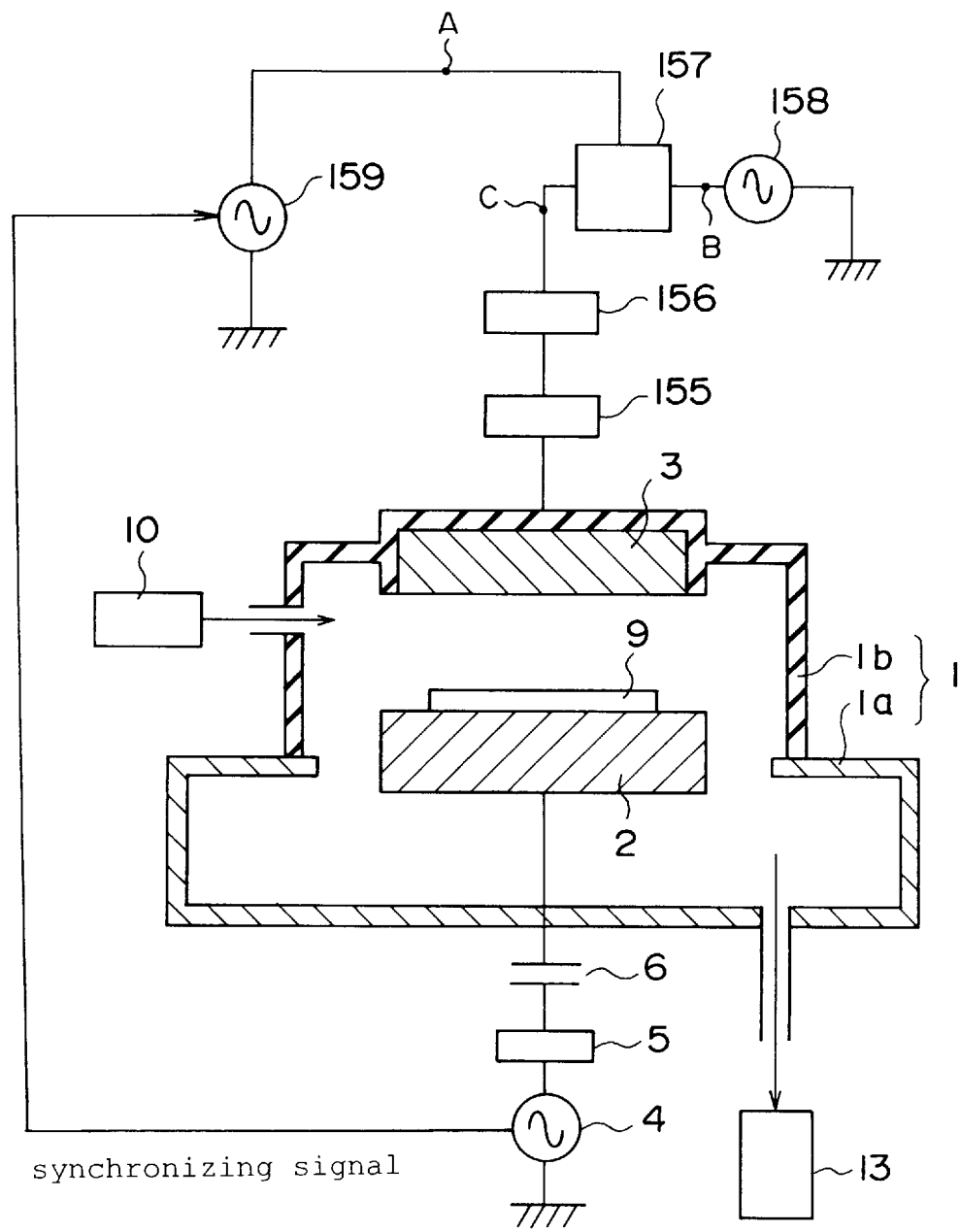
FIG. 9 is a view showing a plasma equipment in which a control mechanism for turning on/off high frequency electric power supplied to the counter electrode is provided.

FIG. 9 is a view showing a plasma equipment in which a control mechanism for turning on/off high frequency electric power supplied to the counter electrode is provided. In FIG. 9, like references used in FIG. 8 denote like parts in FIG. 6 and thus their detailed explanations are omitted. FIG. 10 is a waveform chart showing waveforms at points A, B, and C in FIG. 9.

A high frequency oscillator 158 outputs a high frequency sinusoidal signal, as shown by a waveform at a point B in FIG. 10. This high frequency signal is input into an on/off modulator 157. The on/off modulator 157 is on/off-controlled by a signal output from a pulse generator 159. A pulse generator 159 outputs a rectangular pulse signal having a peak value of 5 V, as shown by a waveform at a point A in FIG. 10. The output of the pulse generator 159 is synchronized with the output of the high frequency power source 4. The on/off modulator 157 transfers the output of the high frequency oscillator 158 to an amplifier 156 when the signal output from the pulse generator 159 is at "H" level while it cuts off the output of the high frequency oscillator 158 when the signal output from the pulse generator 159 is at "L" level. Thus, a signal shown as a waveform at a point C in FIG. 10 is input into the amplifier 156. The amplifier 156 amplifies this input signal and supplies high frequency electric power intermittently to the counter electrode 3 via a matching box 155. Like the above, the plasma equipment can be achieved wherein high frequency electric power is supplied to the counter electrode 3 in a period when the substrate bias electrode 2 is acting as the anode.

Figure 11:
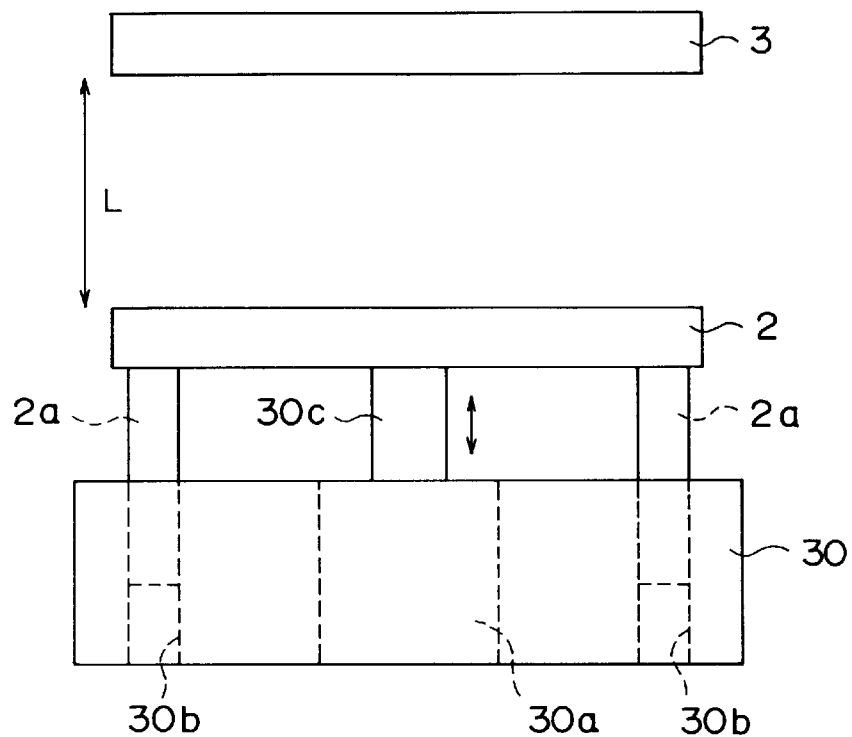
FIG. 11 is a view showing a lifting mechanism for the substrate bias electrode.

In the plasma equipment shown in FIG. 6, depending upon kinds or pressure of the gas used, a location of the counter electrode 3 or the substrate bias electrode 2 may be easily changed in a vertical direction. For example, FIG. 11 is a view showing a lifting mechanism for the substrate bias electrode 2. A base 30 includes a driving portion 30a consisting of motor, gears, etc. in its center portion, and a shaft 30c is moved upwardly and downwardly in compliance with normal rotation/reverse rotation of the motor. Guide holes 30b are formed at four corners of the base 30. Rods 2a are provided at four lower corners of the substrate bias electrode 2 to be inserted into the guide holes 30b of the base 30. The substrate bias electrode 2 is connected to a driving shaft 30c.

For purposes of example, with the use of plural gas kinds and gas pressure, etching is effected in the same chamber by step etching. Change in gas kinds and gas pressure causes change in mean free path of electron.

By providing the lifting mechanism for the substrate bias electrode 2 shown in FIG. 11, charge damage can be prevented by adjusting the distance between the electrodes 2, 3 in accordance with gas kinds and gas pressure even if step etching is utilized.

(Second Embodiment)

Figure 20:
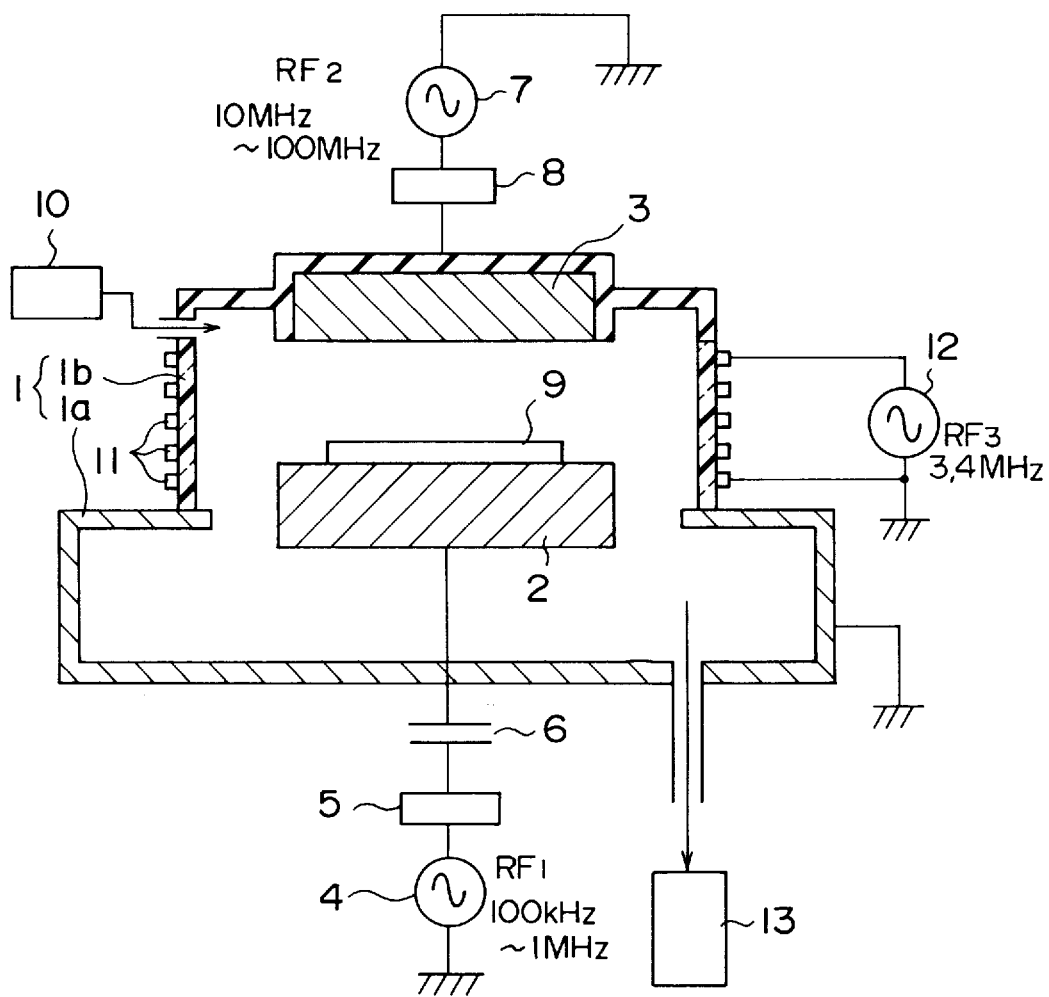
FIG. 20 is a schematic sectional view showing a plasma equipment according to a second embodiment of the present invention.

FIG. 20 is a schematic sectional view showing a plasma equipment according to a second embodiment of the present invention. In the second embodiment, the present invention is applied to an inductively coupled plasma (ICP) equipment. In FIG. 20, like references used in FIG. 6 refer to like parts in FIG. 6, and thus their detailed explanations are omitted.

In the second embodiment, a coil 11 is wound around an outer periphery of a bell jar 1b. High frequency electric power of frequency $RF_3$ of 3.4 MHz is supplied from a high frequency power source 12 to the coil 11. Thus, high frequency inductive field is generated between the electrodes 2, 3 in the chamber 1 in a vertical direction. A portion of the bell jar 1b on which the coil 11 is wound is formed of glass. A chamber main body 1a is formed of aluminum and is connected to ground.

In the second embodiment, in addition to the same advantage as in the first embodiment, such an advantage can be achieved that high plasma density can be obtained even if gas pressure is low since plasma is heated by inductive field generated by the coil 11.

In the case of the equipment of the type wherein energy is applied to the gas in the chamber by virtue of capacitive coupling via the electrode, such as the first embodiment show in FIG. 6, if the gas pressure is low, plasma density becomes low. And if the gas pressure is excessively low, plasma cannot be generated and maintained. However, the equipment of the second embodiment, show in FIG. 20, energy is applied to the gas in the chamber not through the electrodes, and plasma density becomes high, though the gas pressure is low. In the second embodiment, Such an advantage can be obtained that, gas pressure can be low, and the mean free path of electron becomes long to thus relax constriction of the distance between the electrodes. In addition, such another advantages con be obtained that, etching characteristics can be improved and the like, as well known in the prior art.

With the use of the plasma equipment of the second embodiment, examination results of a relationship between frequency of high frequency power source and charge damage will be explained hereinbelow.

With the use of the plasma equipment shown in FIG. 20, inventors of the present invention have examined acceleration effect of electron by plasma sheath electric field which is generated by high frequency electric power supplied to the substrate bias electrode 2. Argon (Ar) gas is used. Flow rate of gas is 50 sccm, pressure is 10 mTorr, and ICE input power, i.e., power applied to the coil 11 is 500 W. Frequency of high frequency electric power supplied to the substrate bias electrode 2 is selected as 13.56 MHz, 1 MHz, 600 kHz, 400 kHz, 200 kHz or 100 kHz. At this event, no high frequency electric power is supplied to the counter electrode 3.

Figure 21:
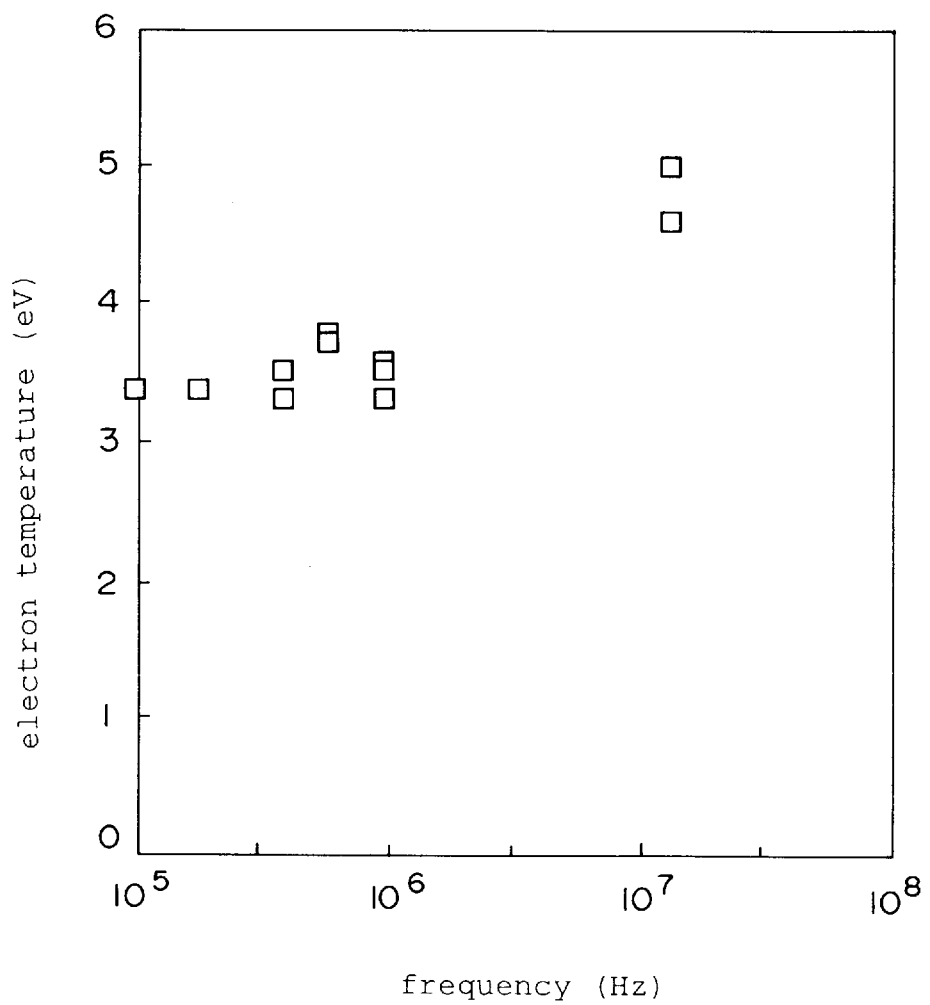
FIG. 21 is a graph illustrative of a relationship between frequency of high frequency electric power supplied to a first electrode and electron temperature.

According to the Langmuir Probe method shown in FIG. 12, electron temperature of plasma has been measured at a location higher by 20 mm than the center portion of the substrate bias electrode 2. FIG. 21 is a graph illustrative of a relationship between frequency of high frequency electric power supplied to the first electrode and electron temperature, wherein an abscissa denotes the frequency while an ordinate denotes the electron temperature. As evident from FIG. 21, acceleration effect of electron by plasma sheath electric field depends on the frequency of high frequency electric power supplied to the substrate bias electrode, and electron temperature hardly increases in the frequency range from 100 kHz to 1 MHz. Conversely, in case the high frequency electric power of 13.56 MHz is supplied to the substrate bias electrode 2, electron temperature is increased remarkably. As a result, it is preferable that frequency of the high frequency electric power supplied to the substrate bias electrode 2 would be selected within 100 kHz to 1 MHz.

Next, if the semiconductor wafer is exposed to static eliminating plasma after the aluminum wirings are etched, charge damage reduction effect obtained by the plasma equipment of the second embodiment will be explained hereinbelow.

The chamber (bell jar) 1 of the plasma equipment is formed of quartz or glass, which is of 500 mm diameter, 200 mm height, and 5 mm thick. A copper strip coil which has a thickness of 0.2 mm, a width of 10 mm, and a length of 10 m is wound around the chamber 1 as the coil 11 to have five turns. A distance between the substrate bias electrode 2 and the counter electrode 3 is 5 cm.

Meanwhile, a plurality of gate electrodes which are formed via a gate oxide film of 8 nm thick are aligned on the semiconductor wafer 9 as a sample. Each gate electrode is a square which has a side of 1 $\mu$m. These gate electrodes are covered with an insulating film. An aluminum film of 0.8 $\mu$m is formed on the insulating film. The aluminum film is electrically connected to the gate electrodes via contact holes formed selectively in the insulating film. Three kinds of samples each has an antenna ratio on the order of $10^4$, $10^5$, or $10^6$ have been prepared. A photoresist pattern having a thickness of 1.6 $\mu$m is formed on the aluminum film.

First, the aluminum film formed on the semiconductor wafer 9 is etched in mixed gas of $Cl_2$ and $BCl_3$ so as not to provide charge damage to the gate electrode.

Then, the semiconductor wafer 9 is exposed to static eliminating plasma. At this time, high frequency electric power of frequency of 3.4 MHz is supplied to the coil 11, high frequency electric power of frequency of 13.56 MHz is supplied to the counter electrode 3, and high frequency electric power of frequency of 400 kHz is supplied to the substrate bias electrode 2. Argon (Ar) gas is used. Flow rate of gas is 50 sccm, pressure is 10 mTorr, and ICE input power is 1 kW. High frequency electric power supplied to the substrate bias electrode 2 is 50 W. While changing power of high frequency electric power supplied to the counter electrode 3 is selected as 50 W, 100 W, 150 W, a destruction rate of the gate oxide film due to charge damage has been examined. As a result, the destruction rate of the gate oxide film has been 34% when power of high frequency electric power is 50 W, the destruction rate of the gate oxide film has been 18% when power of high frequency electric power is 100 W, and the destruction rate of the gate oxide film has been 4% when power of high frequency electric power is 150 W. The more the high frequency electric power supplied to the counter electrode 3, the less the destruction rate.

It is preferable that frequency of high frequency electric power supplied to the counter electrode 3 would be higher than that of high frequency electric power supplied to the substrate bias electrode 2. However, even if frequency of high frequency electric power supplied to the counter electrode 3 is slightly lower than that of high frequency electric power supplied to the substrate bias electrode 2, the above advantage can be obtained depending upon the magnitude of applied power.

(Third Embodiment)

Figure 22:
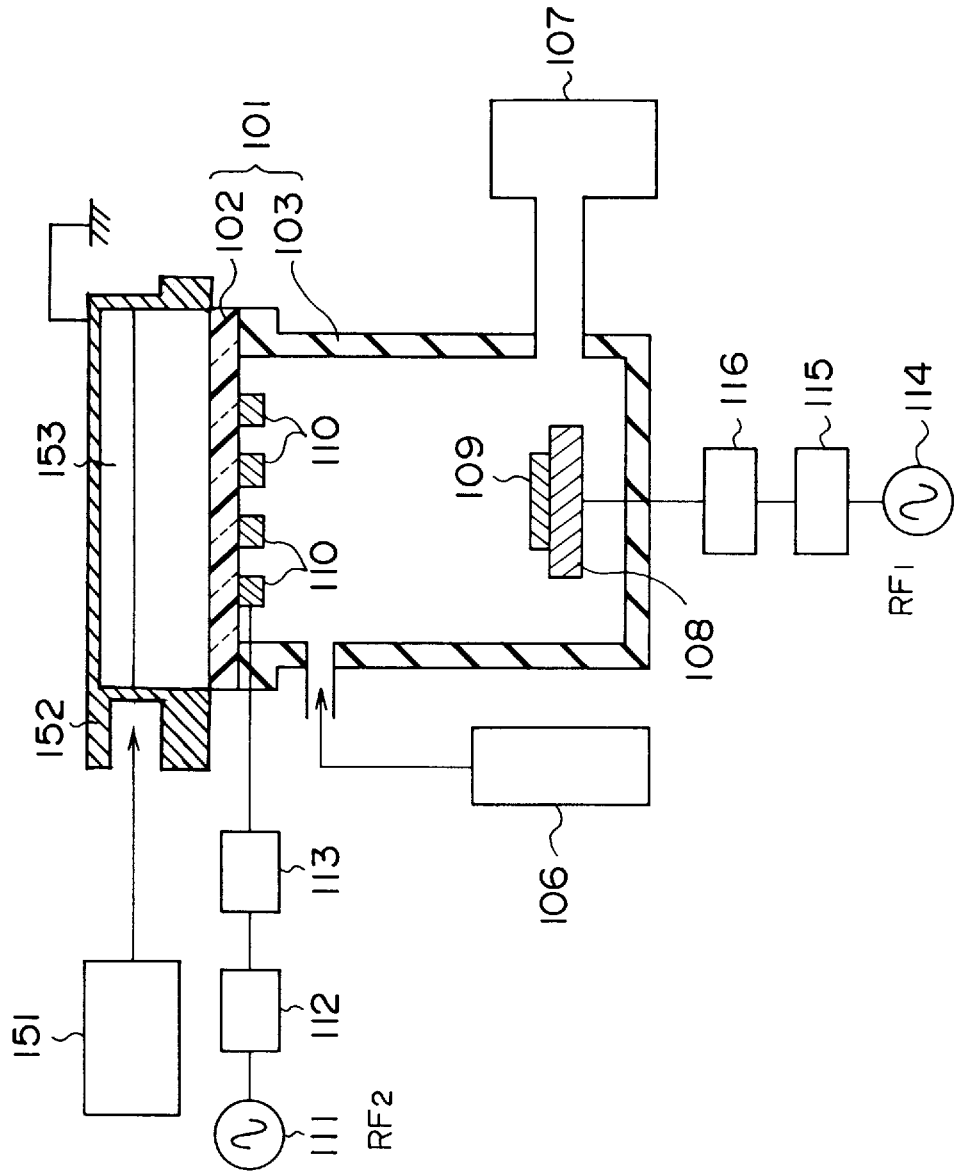
FIG. 22 is a schematic sectional view showing a plasma equipment according to a third embodiment of the present invention.
Figure 23:
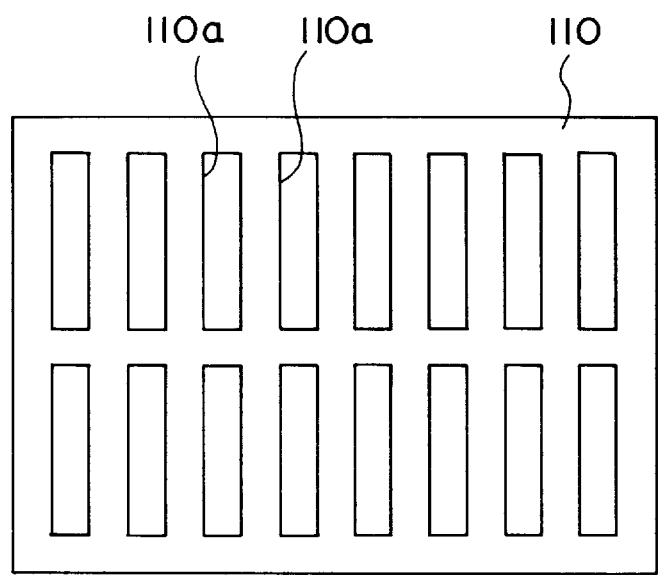
FIG. 23 is a plan view showing a counter electrode of the plasma equipment according to the third embodiment of the present invention.

FIG. 22 is a schematic sectional view showing a plasma equipment according to a third embodiment of the present invention. A chamber 101 comprises a chamber main body 103, and a lid portion 102 formed of quartz or glass plate which is detachably attached to the chamber main body 103. A substrate bias electrode 108 on which a semiconductor wafer 109 is loaded is provided in the chamber 101. High frequency electric power is supplied from a high frequency power source 114 to the substrate bias electrode 108 via a matching circuit 115 and a filter 116. A counter electrode 110 is attached to an under surface of the lid portion 102. The counter electrode 110 has a plurality of rectangular opening portions 110a, as shown in a plan view of FIG. 23. High frequency electric power is supplied from a high frequency power source 111 to the counter electrode 110 via a matching circuit 112 and a filter 113.

A distance between the substrate bias electrode 108 and the counter electrode 110 is set less than two times as long as the mean free path of electron. Any profile of the opening portion 110a provided in the counter electrode 110 may be adopted if microwave can pass therethrough.

The chamber 101 is connected to a gas supplying portion 106 consisting of a gas cylinder, a mass flow controller, and the like. Desired etching gas is supplied from the gas supplying portion 106 to the chamber 101. Further, the chamber 101 is connected to a exhaust pump 107.

A dielectric plate 153 is arranged over the chamber 101. The dielectric plate 153 is connected to a microwave generator 151 via a waveguide 152.

A case will be explained wherein the aluminum film (see FIG. 2) on the semiconductor wafer 109 is etched with the use of the plasma equipment constructed as above. First, after an inside of the chamber 101 is exhausted by a exhaust pump 107, $Cl_2$ gas is supplied as etching gas, for example, from the gas supplying portion 106 to the chamber 101. Pressure in the chamber 101 is maintained at about 3 mTorr.

Next, a microwave oscillator 151 is operated. Then, the microwave output from the microwave oscillator 151 is supplied to a dielectric plate 153 via a waveguide 152 to thus generate standing waves in the dielectric plate 153. This standing waves enter into the chamber 101 via the lid portion 102 and opening portions 110a of the counter electrode 110. Under this condition, high frequency electric power of 100 kHz to 1 MHz is supplied from a high frequency power source 114 to the substrate bias electrode 108, while high frequency electric power of 10 MHz to 100 MHz is supplied from a high frequency power source 111 to the counter electrode 110. In this event, since plasma is heated by the microwave which enters into the chamber 101 via the lid portion 102, plasma density is enhanced even if the pressure is low.

By the ions in plasma reaching to the aluminum film via the opening portions in the resist on the semiconductor wafer 109, the aluminum film is etched. At this time, on the counter electrode 110 side, electrons in plasma are accelerated toward the substrate bias electrode 108 side based on high frequency electric power supplied to the counter electrode 110. Since electrons collide with molecules in plasma until they reach the semiconductor wafer 109, anisotropy of electron temperature is attenuated. However, in the third embodiment, since the distance between the substrate bias electrode 108 and the counter electrode 110 is set less than two times as long as the mean free path of electron, electrons reach the bottoms of the opening portions 36a of the resist while they maintain sufficient anisotropy of electron temperature, as shown in diagrammatic illustration of FIG. 14B. As a result, positive charges accumulated on the bottoms of the opening portions 36a of the resist are neutralized with such electrons to avoid charge damage.

In the third embodiment, as shown in FIGS. 8A and 8B, it would be preferable that an output of the second high frequency power source 111 is controlled such that high frequency electric power supplied to the counter electrode 110 is in an on-state in a period when the substrate bias electrode 108 is acting as anode while high frequency electric power supplied to the counter electrode 110 is in an off-state in a period when the substrate bias electrode 108 is acting a cathode. Thus, with suppressing increase in electron temperature, the third embodiment is capable of making electrons enter effectively into the opening portions of the resist.

In the third embodiment, an alterable distance between the substrate bias electrode 108 and the counter electrode 110 may be used.

Figure 24:
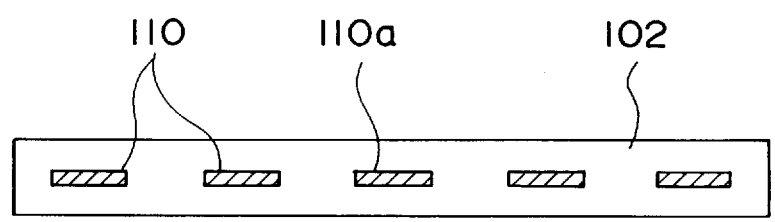
FIG. 24 is a sectional view showing a lid portion in which counter electrodes are buried.

As shown in FIG. 24, the counter electrode 110 may be buried in the lid portion 102 formed of quartz or glass. In the counter electrode 110 shown in FIG. 22, it is feared that particles generated by etching stick to insides of the opening portions 110a to therefore prevent the microwave from entering into the chamber 101. However, since the counter electrode 110 shown in FIG. 24 is buried in the lid portion 102, particles in no means adhere between the opening portions 110a of the counter electrode 110. In addition, because no unevenness is formed on a surface of the lid portion 102, particles stuck to the lid portion 102 can be removed readily.

(Fourth Embodiment)

Figure 25:
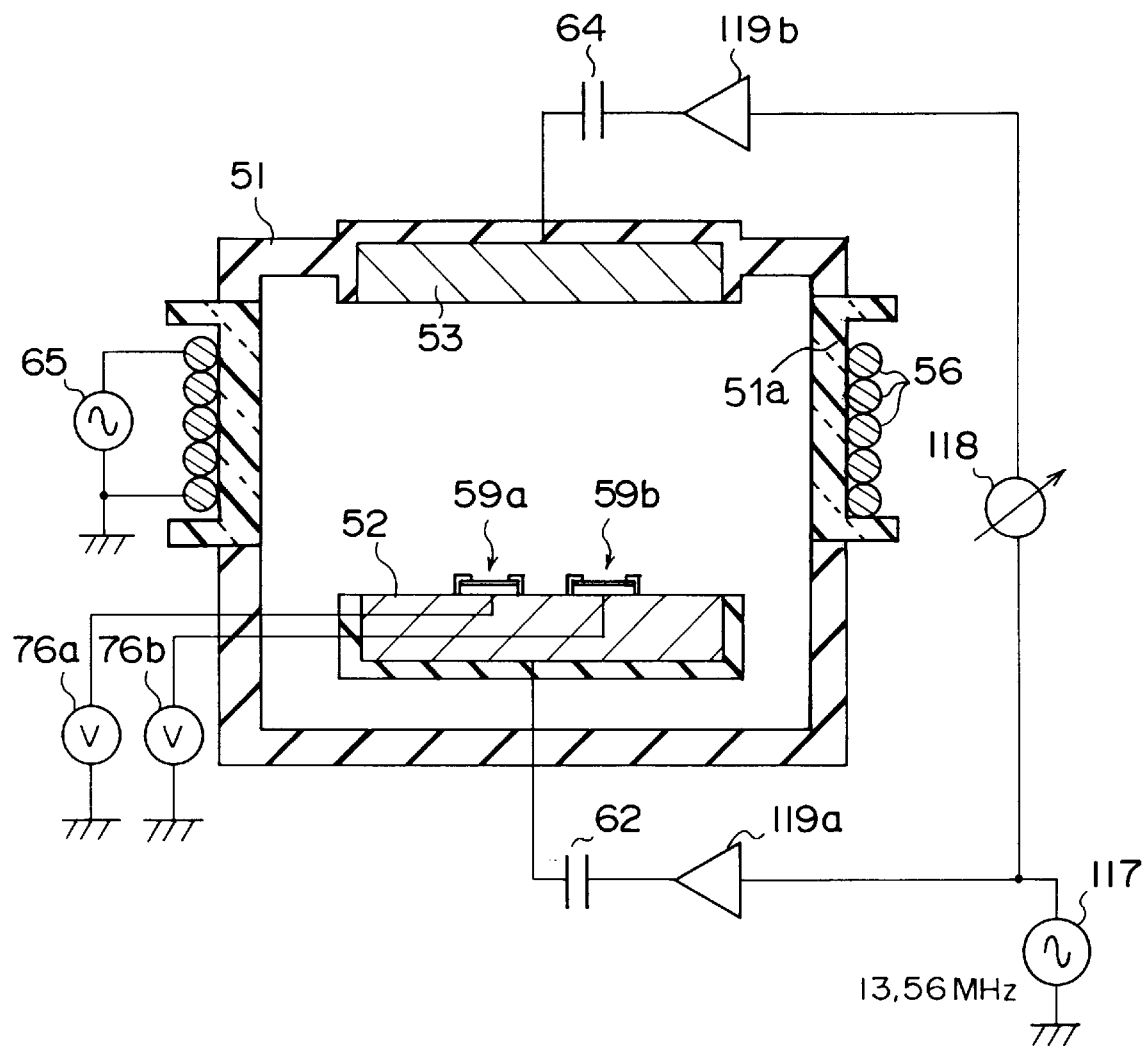
FIG. 25 is a block diagram showing a power supplying portion in a plasma equipment according to a fourth embodiment of the present invention.

FIG. 25 is a block diagram showing a plasma equipment according to a fourth embodiment of the present invention. In FIG. 25, a gas supplying portion and an exhaust pump are omitted.

A first electrode 52 i.e., a substrate bias electrode is arranged in the chamber 51. A semiconductor wafer is loaded on the first electrode 52. A second electrode 53, i.e., A counter electrode is arranged over the first electrode 52. A coil 56 is wound around an outer periphery of the chamber 51, and high frequency electric power is supplied from a high frequency power source 65 to the coil 56.

High frequency electric power is supplied from a high frequency power source 119a to the first electrode 52 via a capacitor 62. The high frequency power source 119a outputs high frequency electric power having frequency which is synchronous with that of a signal output from a signal generator 117. For instance, the signal generator 117 outputs the signal having frequency of 13.56 MHz. High frequency electric power is supplied from a high frequency power source 119b to the second electrode 53 via a capacitor 64. The high frequency power source 119b also. outputs high frequency electric power having frequency which is synchronous with that of the signal output from a signal generator 117. However, a phase shifter 118 is inserted between the high frequency power source 119b and the signal generator 117 to control phase of the signal supplied from the high frequency power source 119b.

With the use of the plasma equipment constructed as above, results of examination as with reduction in charge-up will be explained hereinbelow.

Samples 59a, 59b similar to those used in the examination shown in FIG. 15 as above are loaded on the first electrode 52. The distance between the first electrode 52 and the second electrode 53 is set to be 160 mm. The sample 59a is connected to the voltmeter 76a and the sample 59b is connected to the voltmeter 76b.

Ar gas is introduced into the chamber 51. Pressure in the chamber 51 is maintained at 2.5 mTorr. High frequency electric power of voltage (Vp-p) 200 V and frequency 13.56 MHz is supplied to the first electrode 52. High frequency electric power of voltage (Vp-p) 360 V and frequency 13.56 MHz is supplied to the second electrode 53. By changing phase of high frequency electric power output from the high frequency power source 119b by the phase shifter 118, voltage differences between the samples 59a, 59b have been examined.

Figure 26:
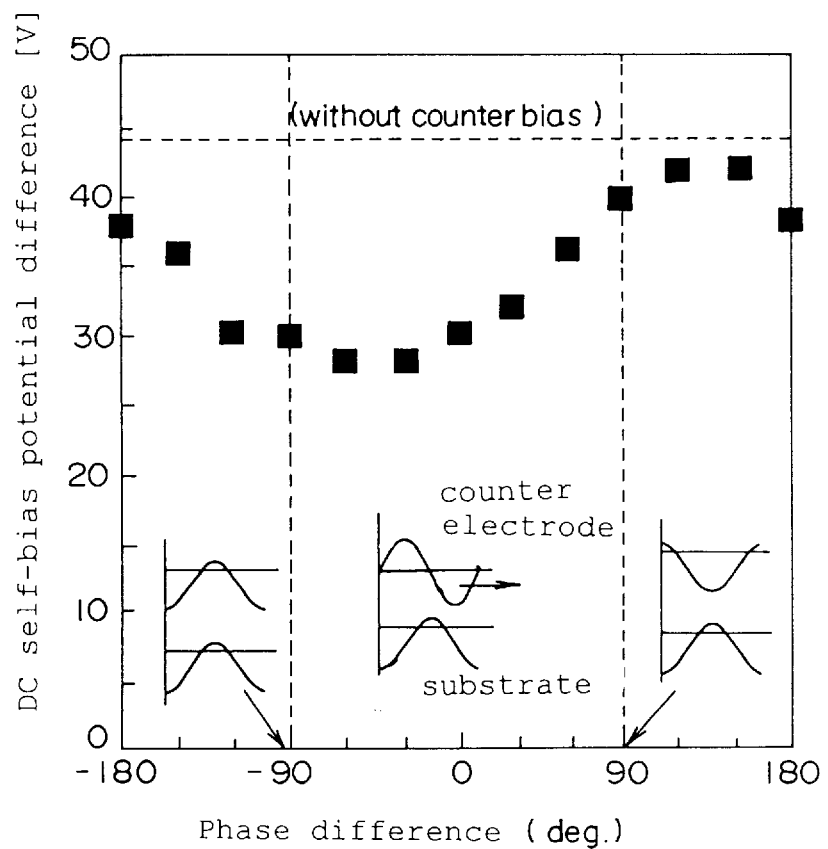
FIG. 26 is a graph illustrative of a relationship between DC self-bias potential difference and phase difference in high frequency electric power supplied to the first and second electrodes.

FIG. 26 is a graph illustrative of a relationship between DC self-bias voltage difference and phase difference in high frequency electric power supplied to the first and second electrodes, wherein an abscissa denotes phase difference while an ordinate denotes DC self-bias voltage difference. Where the charging voltage (without counter bias) has been about 44 V in case high frequency electric power is not supplied to the second electrode 53. We have been able to appreciate from FIG. 26 that charge-up can be reduced by controlling phase difference in high frequency electric power supplied to the first and second electrodes 52, 53. We also have been able to appreciate from FIG. 26 that, although essentially high energy electrons ought not to move to the first electrode 52 side if the second electrode 53 is acting as the anode, charge-up reduction effect can still be attained. According to this fact, a time required for moving electron from one electrode to the other electrode should not be disregarded in comparison with a period time of high frequency electric power. In other words, optimum phase difference in reducing charge-up will vary in compliance with the distance between the electrodes.

(Fifth Embodiment)

Figure 27:
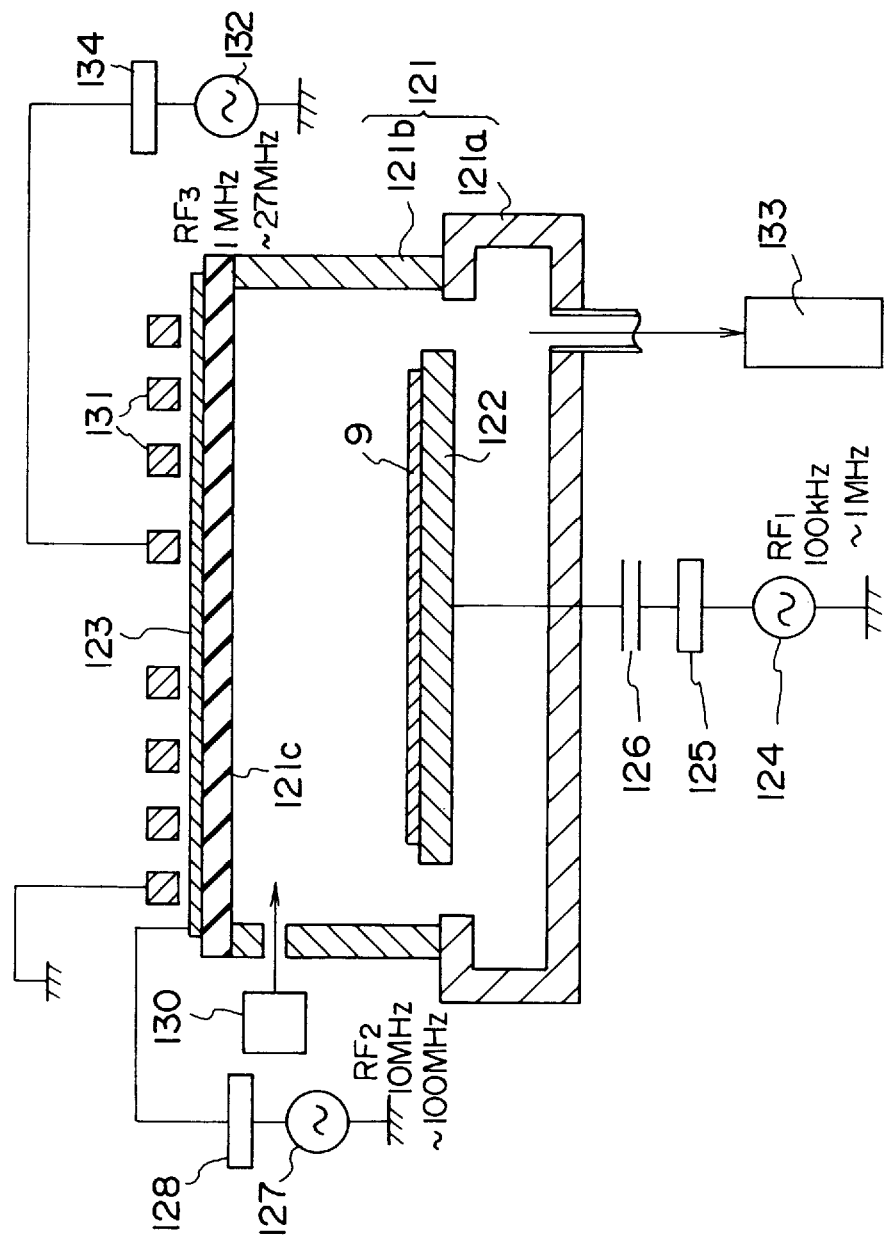
FIG. 27 is a sectional view showing a plasma equipment according to a fifth embodiment of the present invention.

FIG. 27 is a sectional view showing a plasma equipment according to a fifth embodiment of the present invention.

Figure 28:
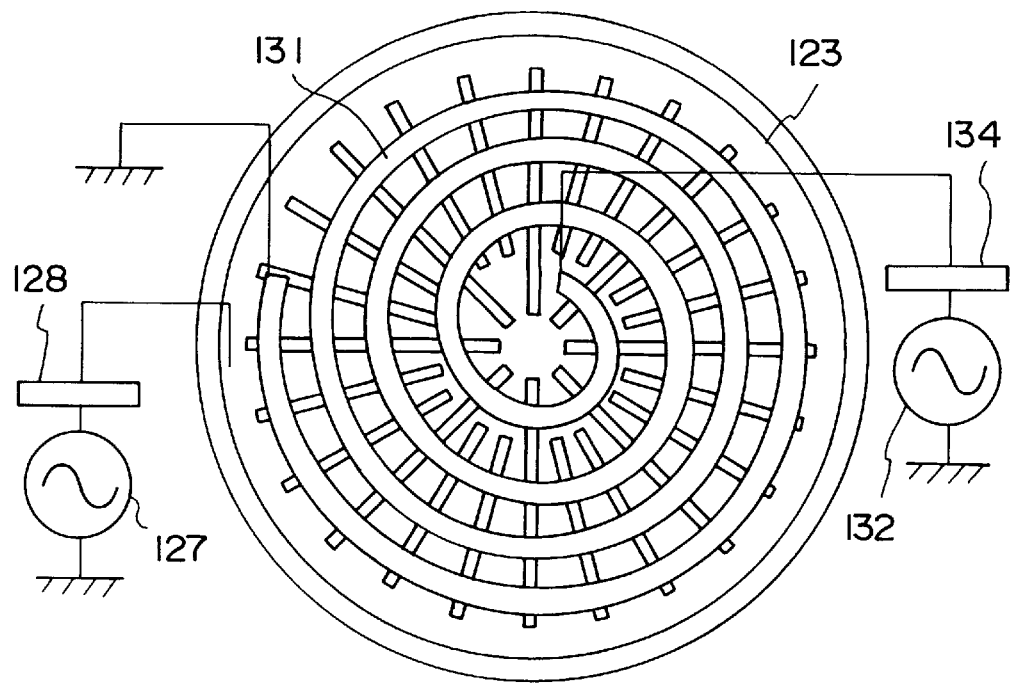
FIG. 28 is a top view showing the plasma equipment according to the fifth embodiment in FIG. 27.
Figure 29:
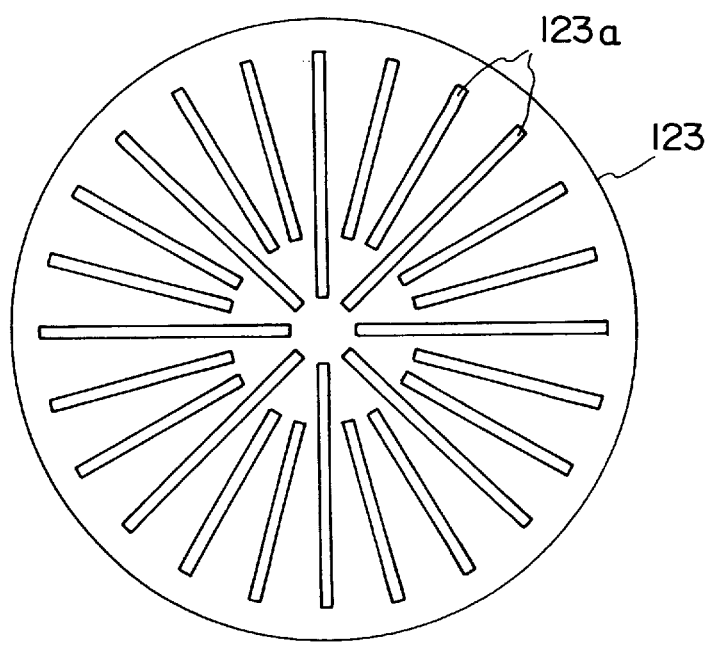
FIG. 29 is a top view showing a counter electrode of the plasma equipment according to the fifth embodiment in FIG. 27.

FIG. 28 is a top view showing the plasma equipment according to the fifth embodiment in FIG. 27. FIG. 29 is a top view showing A counter electrode of the plasma equipment according to the fifth embodiment in FIG. 27. In the fifth embodiment, the present invention is applied to a TCP (Transformer Coupled Plasma) equipment.

A chamber 121 is composed of a chamber main body 121a, and a bell jar 121b detachably attached to the chamber main body 121a. An upper wall portion 121c of the bell jar 121b is formed of dielectric material. A substrate bias electrode 122 is arranged in the chamber 121 and a semiconductor wafer 9 is loaded on the substrate bias electrode 122. High frequency electric power of frequency $RF_1$ is supplied from a high frequency power source 124 to the substrate bias electrode 122 via a matching circuit 125 and a capacitor 126. The frequency $RF_1$ is selected in the range of 100 kHz to 1 MHz.

A circular-disk type counter electrode 123 is arranged on the bell jar 121b so as to oppose to the substrate bias electrode 122. The counter electrode 123 is made of copper plate and, as shown in FIG. 29, a large number of slits 123a are formed in a radial fashion therein. High frequency electric power of frequency $RF_2$ is supplied from a high frequency power source 127 to the counter electrode 123 via a matching circuit 128. The frequency $RF_2$ is selected within the range of 10 MHz to 100 MHz. The distance between the substrate bias electrode 122 and the counter electrode 123 is set to about 50 mm.

A spiral coil 131 is arranged over the counter electrode 123. This coil 131 is electrically isolated from the counter electrode 123. High frequency electric power of frequency $RF_3$ is supplied from a high frequency power source 132 to the spiral coil 131 via a matching circuit 134. The frequency $RF_3$ is selected within the range of 1 MHz to 27 MHz.

The chamber 121 is connected to a gas supplying portion 130 consisting of a gas cylinder, a mass flow controller, and the like. Selected gas is supplied at a preselected flow rate from the gas supplying portion 130 to the chamber 121. Further, the chamber 121 is connected to an exhaust pump 133.

In the plasma equipment constructed as mentioned above, while etching gas such as $Cl_2$ is supplied from the gas supplying portion 130 into the chamber 121, an inside of the chamber 121 is exhausted by the exhaust pump 133 so as to keep the pressure in the chamber 121 at 1 mTorr to 30 mTorr. Here it is assumed that the pressure in the chamber 121 is kept at 5 mTorr.

In addition, high frequency electric power of the frequency $RF_3$ of 1 MHz to 27 MHz is supplied from the high frequency power source 132 to the spiral coil 131. Simultaneously, high frequency electric power of the frequency $RF_1$ of 100 kHz to 1 MHz is supplied from a high frequency power source 124 to the substrate bias electrode 122, and high frequency electric power of the frequency $RF_2$ of 10 MHz to 100 MHz is also supplied from a high frequency power source 127 to the counter electrode 123.

High frequency inductive field can be generated by the high frequency electric power supplied to the spiral coil 131 in the chamber 121. Plasma is then heated by electric field generated by this high frequency magnetic field.

In the meanwhile, potential of the semiconductor wafer 9 is biased by the high frequency electric power supplied to the substrate bias electrode 122, then ions in plasma are accelerated toward the semiconductor wafer 9 to thus etch the aluminum film, etc. on the semiconductor wafer 9.

A sheath width between the upper wall portion 121a and plasma is varied with time by the high frequency electric power supplied to the counter electrode 123 in units of frequency $RF_3$. Thereby, electrons in plasma are accelerated toward the semiconductor wafer 9. The mean free path of electron is about 50 mm if pressure in the chamber 121 is 3 mTorr, and the mean free path of electron is about 30 mm if pressure in the chamber 121 is 5 mTorr. Since the distance between the electrodes is set less than twice as long as the mean free path of electron, most of accelerated electrons can reach the semiconductor wafer 9 without scattering. Thus charge damage and deterioration in etching characteristics can be reduced.

In the fifth embodiment, eddy current is caused in the counter electrode 123 when high frequency magnetic field generated by the spiral coil 131 passes through the counter electrode 123. However, as shown in FIG. 29, since radial slits 123a are provided in the counter electrode 123, loss caused by eddy current becomes relatively small.

Figure 30:
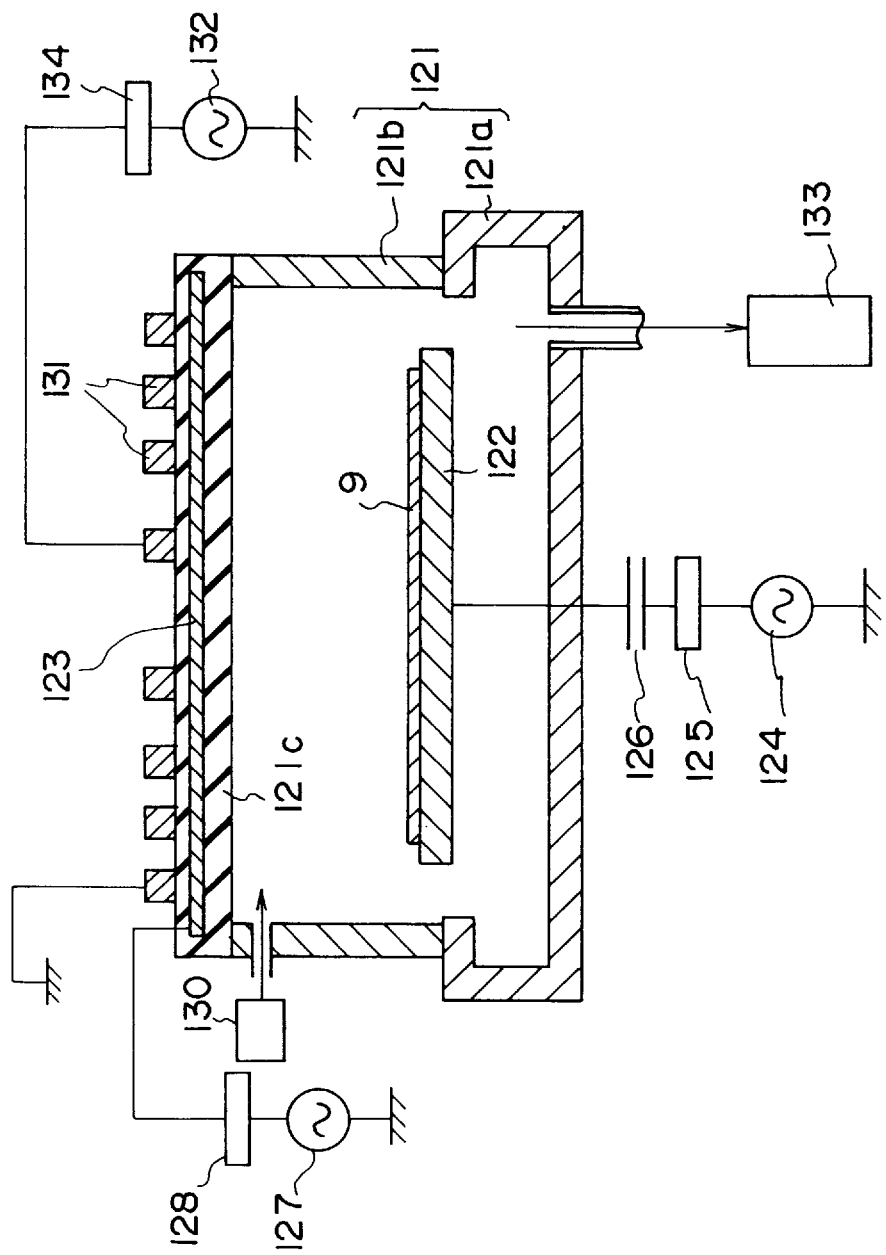
FIG. 30 is a sectional view showing a modification of the plasma equipment according to the fifth embodiment in FIG. 27.

As shown in FIG. 30, the counter electrode 123 may be buried in the upper wall portion 121c made of dielectric material. In this event, advantages similar to the above can be obtained.

(Sixth Embodiment)

Figure 31:
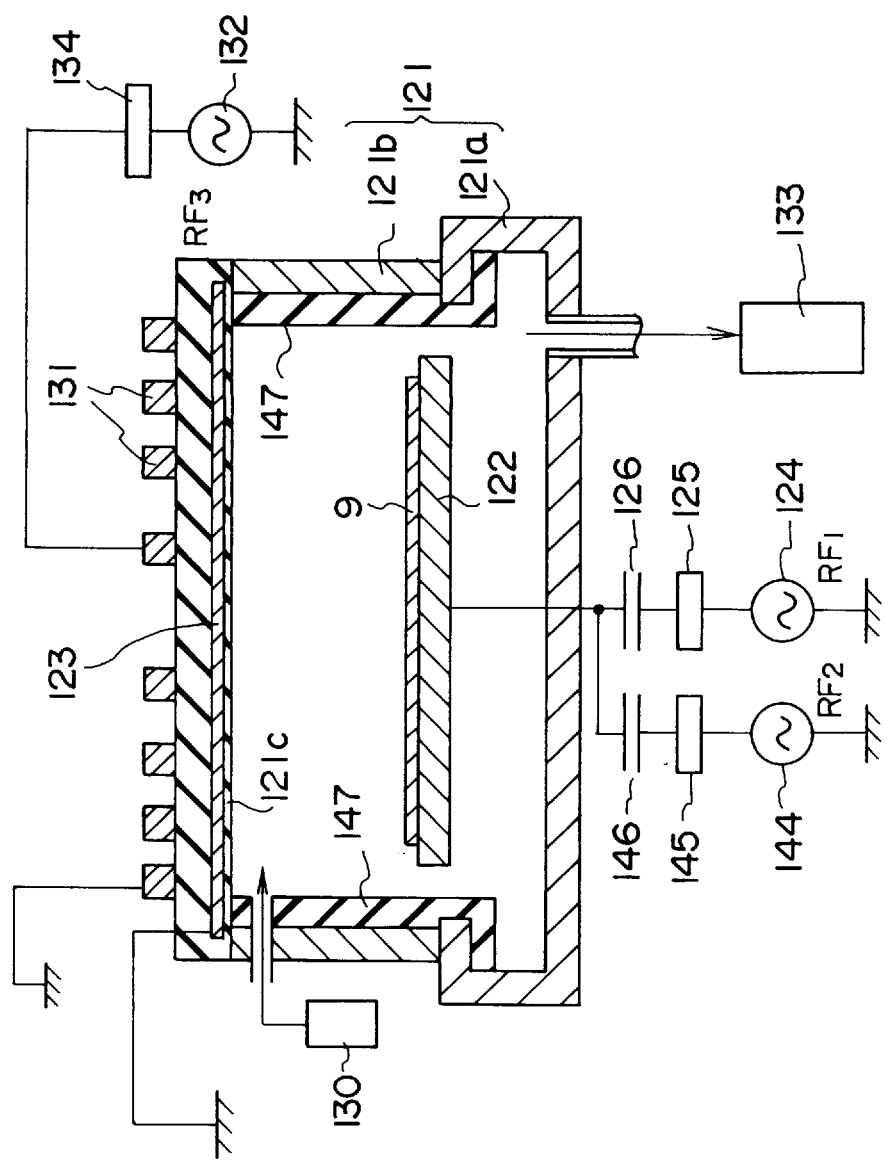
FIG. 31 is a sectional view showing a plasma equipment according to a sixth embodiment of the present invention.

FIG. 31 is a sectional view showing a plasma equipment according to a sixth embodiment of the present invention. In the sixth embodiment, like references in FIG. 27 identify like parts in FIG. 27 and thus their detailed explanations are omitted.

The upper wall portion 121c of the chamber 121 is formed of dielectric material, and the counter electrode 123 is buried in the chamber 121. The counter electrode 123 is connected to ground.

An insulating film 147 is coated on an inner wall of the chamber 121. A thickness of the insulating film 147 is sufficiently thick rather than a thickness of the upper wall portion 121c located below the counter electrode 123, and is set ten times as thick as that of the upper wall portion 121c, for example.

To the substrate bias electrode 122 on which the semiconductor wafer 9 is loaded are supplied high frequency electric power of frequency $RF_1$ of 100 kHz to 1 MHz from the high frequency power source 124 via a matching circuit 125 and a capacitor 126 and high frequency electric power of frequency $RF_2$ of 10 MHz to 100 MHz from the high frequency power source 144 via a matching circuit 145 and a capacitor 146.

In the foregoing plasma equipment constructed, the semiconductor wafer 9 is loaded on the substrate bias electrode 122. While etching gas such as $Cl_2$ is introduced into the chamber 121, an interior of the chamber 121 is exhausted by operating the exhaust pump 133 so as to keep the pressure in the chamber 121 at 5 mTorr, for instance. Then, high frequency electric powers of the frequencies $RF_1$, $RF_2$ are supplied respectively from the high frequency power sources 124, 144 to the substrate bias electrode 122, and simultaneously high frequency electric power of the frequency $RF_3$ is supplied from the high frequency power source 132 to the spiral coil 131. At that time, plasma is generated in the chamber 121 by inductive field which is generated by the spiral coil 131. Potential of plasma is modulated by high frequency electric power supplied from the high frequency power source 144, so that electron near the counter electrode 123 which is kept at ground potential are accelerated toward the substrate bias electrode 122. As a result, advantages analogous to that in the fifth embodiment can be achieved in the sixth embodiment.

In the sixth embodiment, since the insulating film 147 is formed on the inner surface of the chamber 121, electric coupling between plasma and the side wall of the chamber can be reduced.

Figure 32A:
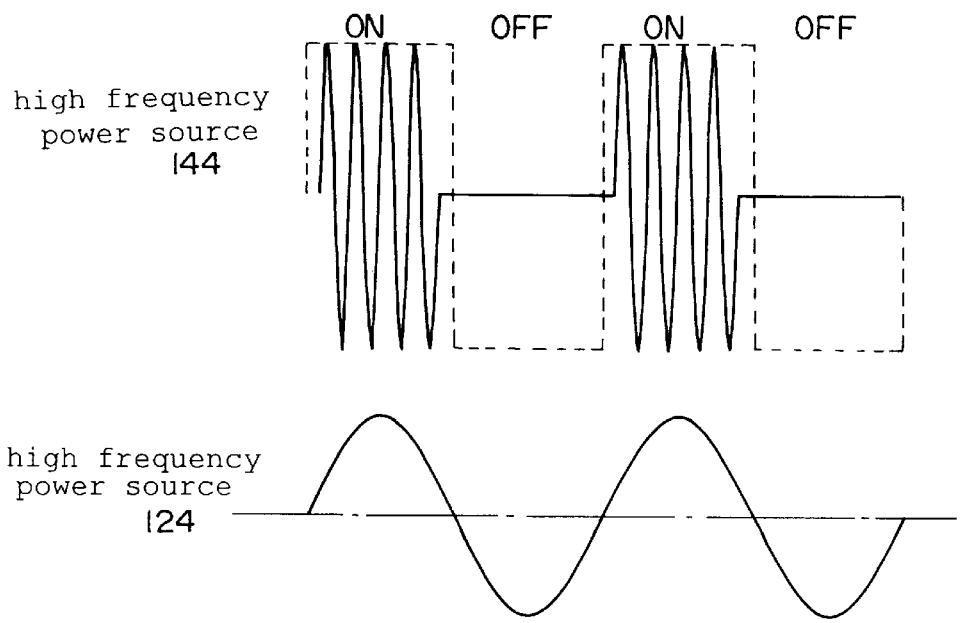
FIG. 32A is a waveform chart showing an example of output waveforms of the first and second high frequency power sources.
Figure 32B:
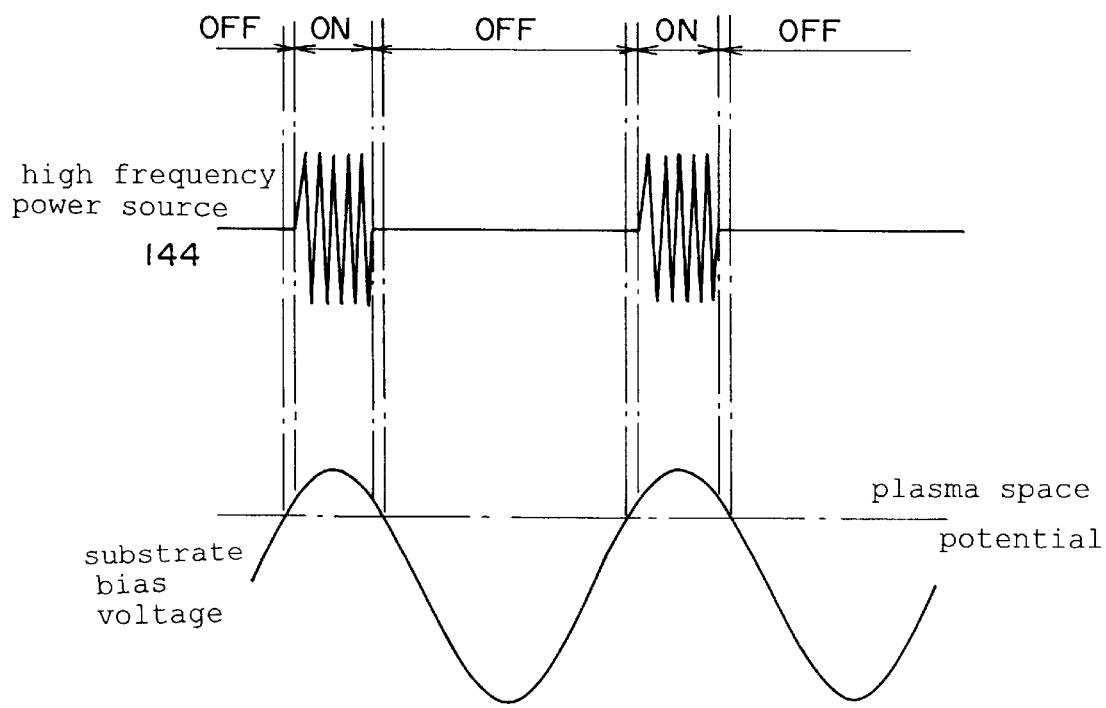
FIG. 32B is a waveform chart showing another example of output waveforms of the first and second high frequency power sources.

As shown in FIG. 32A, in the sixth embodiment, an output of the second high frequency power source 144 may be controlled such that the second high frequency power source 144 is turned on during when output voltage of the first high frequency power source 124 is in a positive period. Furthermore, as shown in FIG. 32B, an output of the second high frequency power source 144 may be controlled such that the second high frequency power source 144 is turned on during when substrate bias voltage by the first high frequency power source 124 becomes positive against plasma space potential. Therefore, it is feasible to suppress heating of plasma and make electrons reach to the semiconductor wafer effectively.

(Seventh Embodiment)

Figure 33:
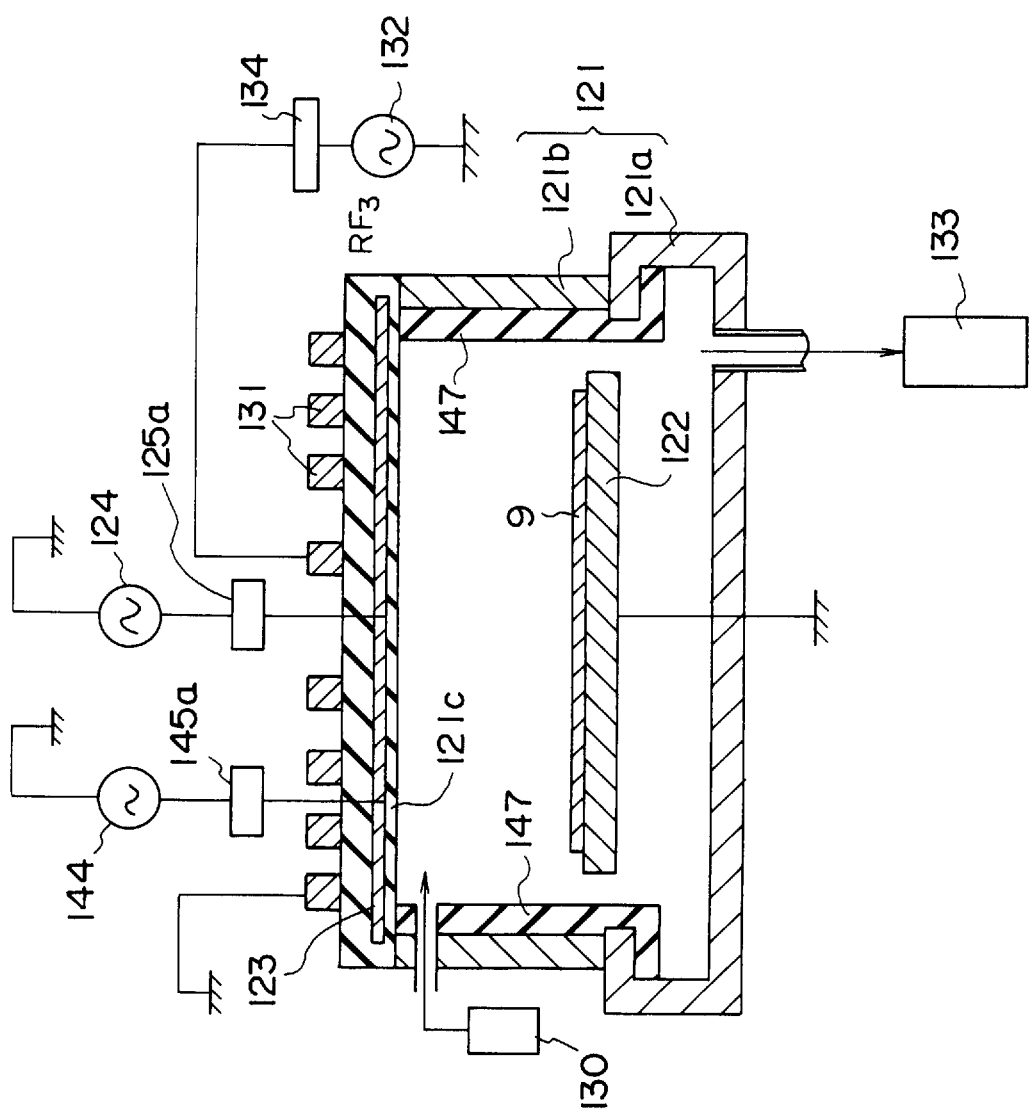
FIG. 33 is a sectional view showing a plasma equipment according to a seventh embodiment of the present invention.

FIG. 33 is a sectional view showing a plasma equipment according to a seventh embodiment of the present invention. In FIG. 33, like references used in FIG. 31 designate like parts in FIG. 31 and therefore their detailed explanations are omitted.

In the seventh embodiment, the substrate bias electrode 122 on which the semiconductor wafer 9 is loaded is connected to ground. Then, high frequency electric power of the frequencies of 100 kHz to 1 MHz is supplied from the high frequency power source 124 to the counter electrode 123 which opposes to the substrate bias electrode 122 via the matching circuit 125a, and at the same time high frequency electric power of the frequency of 10 MHz to 100 MHz is supplied from the high frequency power source 144 to the counter electrode 123 via the matching circuit 145a.

In the seventh embodiment, same advantages as the sixth embodiment can be derived.

(Eighth Embodiment)

Figure 34:
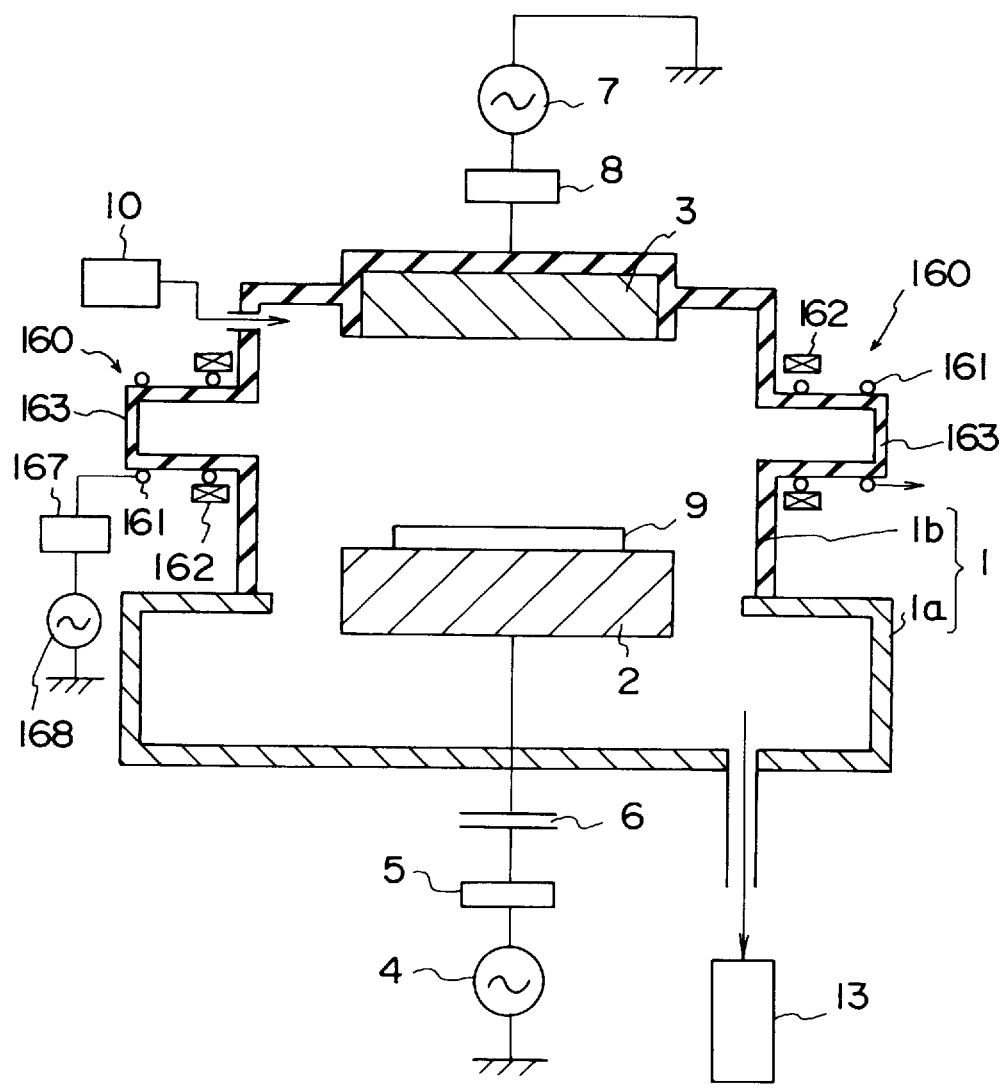
FIG. 34 is a sectional view showing a plasma equipment according to an eighth embodiment of the present invention.

FIG. 34 is a sectional view showing a plasma equipment according to an eighth embodiment of the present invention. In the eighth embodiment, like references used in FIG. 20 refer to like parts in FIG. 20 and therefore their detailed explanations are omitted.

In the eighth embodiment, helicon wave plasma generating portions 160 are provided at four portions, for example, of an outer periphery of the chamber 1. The helicon wave plasma generating portion 160 is composed of a cylindrical portion 163 connected to the chamber 1, an antenna 161 aligned around the cylindrical portion 163, and a coil 162 arranged near the connecting portion between the cylindrical portion 163 and the chamber 1 for generating magnetic field. DC current is supplied from a power source (not shown) to the coil 162. The antenna 161 is connected to the high frequency power source 168 via a matching box 167.

In the plasma equipment according to the eighth embodiment, gas supplied from the gas supplying portion 10 to the chamber 1 enters into the cylindrical portion 163 of the helicon wave plasma generating portion 160. On the contrary, high frequency signal is supplied from the high frequency power source 168 to the antenna 161 via the matching box 167, then electromagnetic wave is emitted to the inside of the cylindrical portion 163 to generate helicon plasma in the cylindrical portion 163. This plasma is caused by inductive field which is generated by the coil 162 to flow out between the electrodes 2, 3 in the chamber 1. High frequency electric power has been supplied from the high frequency power source 7 to the counter electrode 3, like the second embodiment, charge-up can be avoided in etching the semiconductor wafer 9.

Figure 35:
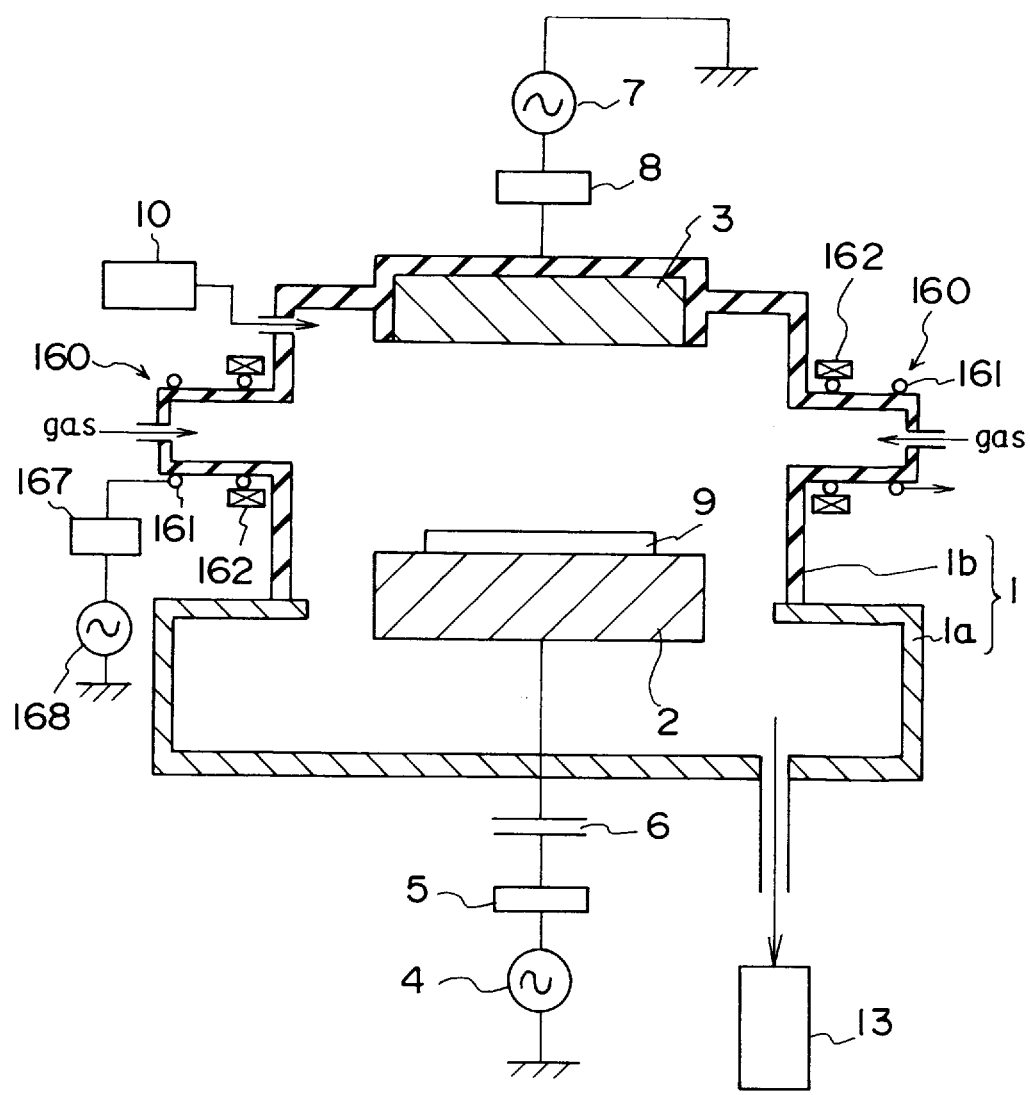
FIG. 35 is a sectional view showing a modification of the plasma equipment according to the eighth embodiment of the present invention.

As shown in FIG. 35, in place of the gas supplying portion 10 for supplying gas into the chamber 1, otherwise together with the gas supplying portion 10, means for supplying gas directly may be provided on the inside of the helicon wave plasma generating portion 160.

(Other Embodiments)

Although the cases where plasma are generated by ICE, TCP, microwave, and helicon wave have been explained as the plasma generating means throughout the above embodiments, ECR, UHF (Ultra High Frequency), and the like may be utilized to generate plasma.

Figure 36A:
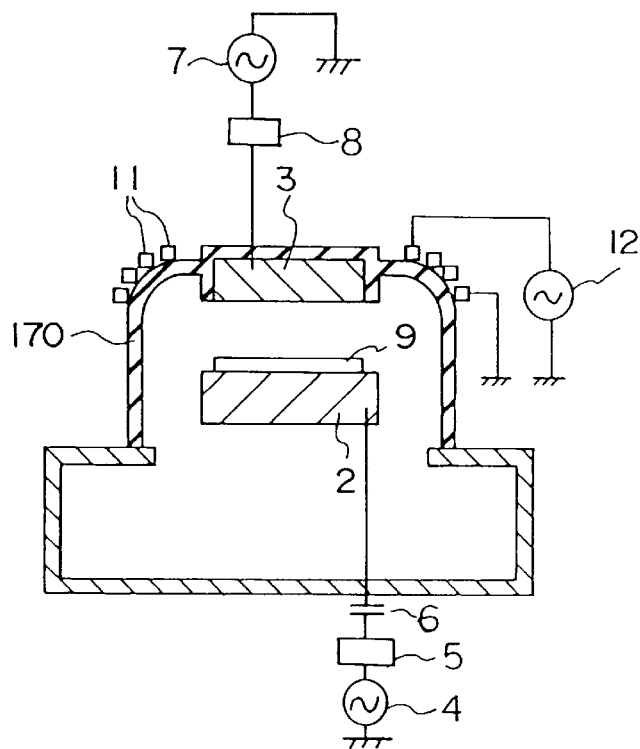
FIG. 36A is a sectional view showing an example of a plasma equipment in which a coil is arranged in a curved portion of an upper portion of a bell jar.
Figure 36B:
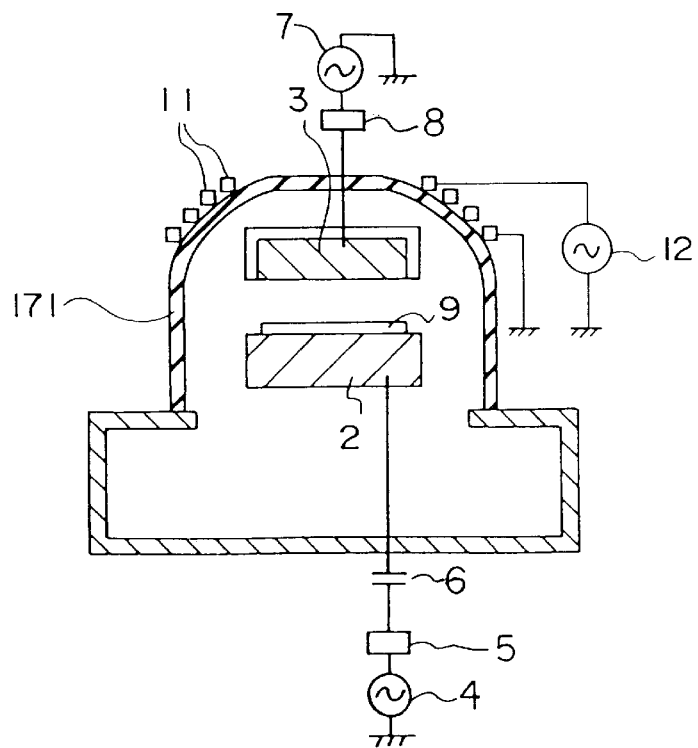
FIG. 36B is a sectional view showing another example of a plasma equipment in which a coil is arranged in a curved portion of an upper portion of a bell jar.

As shown in FIG. 20, the coil 11a for generating magnetic field in the chamber may be wound around the side portion of the bell jar 1b. As shown in FIGS. 36A and 36B, the coil 11 may be arranged in an upper curved portion of dome-like bell jars 170, 171.

Further, although the bias voltage has been applied by supplying high frequency electric power to the substrate in the above embodiments, electrons can be similarly injected into the substrate by the bias applied to the counter electrode in the process without bias such as plasma cleaning process unless the substrate bias voltage is applied.

Furthermore, although plasma etching has been explained throughout the above embodiments, the present invention may be applied to the plasma CVD method.

Figure 37:
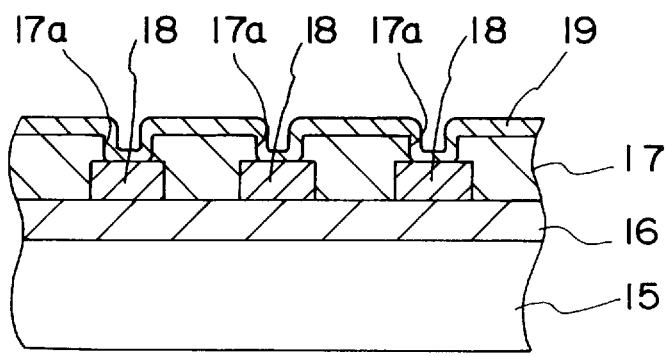
FIG. 37 is a sectional view showing a semiconductor device in which TiN film is formed by a plasma CVD method.

FIG. 37 is a sectional view showing a semiconductor device in which a TiN film is formed by the plasma CVD method. In this semiconductor device, an aluminum (Al) electrode 18 is formed on the silicon substrate 15 via the insulating film 16, then the insulating film 17 is formed so as to cover the aluminum electrode 18, then opening portions 17a are formed in the insulating film 17, and then a TiN film 19 is formed on an all over surface of the resultant structure by the plasma CVD method. Upon forming the TiN film 19, either plasma equipment of the equipments explained throughout the above embodiments may be used. Charge damage of the insulating films 16, 17 caused in forming the TiN film 19 can be prevented.

What is claimed is:

1. A plasma treatment method comprising the steps of:
   loading a semiconductor wafer on a first electrode in a chamber;
   arranging a second electrode to oppose to said first electrode by a distance less than two times as long as a mean free path of electron; and
   generating plasma in said chamber by supplying gas to said chamber, supplying high frequency electric power of first frequency to said first electrode, and supplying high frequency electric power of second frequency which is higher than said first frequency to said second electrode.

2. A plasma treatment method according to claim 1, wherein said first frequency is in a range of 100 kHz to 1 MHz.

3. A plasma treatment method according to claim 1, wherein said second frequency is in a range of 10 MHz to 40 MHz.

4. A plasma treatment method according to claim 1, wherein said second frequency is in a range of 40 MHz to 100 MHz.

5. A plasma treatment method according to claim 1, wherein high frequency electric power of said second frequency is supplied to said second electrode in a period when said first electrode is acting as an anode.

6. A plasma treatment method comprising the steps of:
loading a semiconductor wafer on a first electrode in a chamber;
arranging a second electrode to oppose to said first electrode by a distance less than two times as long as a mean free path of electron;
supplying a first high frequency electric power of a first frequency to said first electrode;
supplying gas to said chamber; and
generating plasma in a space between said first and second electrodes by applying energy to said gas without energy of said first and second electrodes.

7. A plasma treatment method according to claim 6, wherein said first frequency is in a range of 100 kHz to 1 MHz.

8. A plasma treatment method according to claim 6, further comprising a step of:
supplying a second high frequency electric power of a second frequency to said second electrode.

9. A plasma treatment method according to claim 8, wherein said second frequency is in a range of 10 MHz to 40 MHz.

10. A plasma treatment method according to claim 8, wherein said second frequency is in a range of 40 MHz to 100 MHz.

11. A plasma treatment method according to claim 8, wherein said second frequency is an integral multiple of said first frequency.

12. A plasma treatment method according to claim 8, wherein said second frequency is higher than said first frequency.

13. A plasma treatment method according to claim 8, wherein said second high frequency electric power is supplied to said second electrode in a period when said first electrode is acting as an anode.

14. A plasma treatment method according to claim 6, wherein applying said energy is generating high frequency inductive field in said chamber while second high frequency electric power of second frequency is supplied to said second electrode.

15. A plasma treatment method according to claim 6, further comprising steps of:
supplying second high frequency electric power of second frequency to said first electrode;
supplying constant voltage to said second electrode; and
generating high frequency inductive field in said chamber for applying said energy.

16. A plasma treatment method according to claim 15, wherein supplying constant voltage is supplying ground potential.

17. A plasma treatment method according to claim 6, wherein applying said energy is applying electromagnetic wave by the side of a region between said first and second electrodes, and said plasma generated in said region by said electromagnetic wave is introduced in said space between said first and second electrodes.

18. A plasma treatment method comprising the steps of:
loading a semiconductor wafer on a first electrode in a chamber;
arranging a second electrode to oppose to said first electrode by a distance less than two times as long as a mean free path of electron;
supplying a first high frequency electric power of a first frequency to said second electrode;
supplying gas to said chamber; and
generating plasma in a space between said first and second electrodes by applying energy to said gas without energy of said first and second electrodes.

19. A plasma treatment method according to claim 18, wherein said first frequency is in a range of 10 MHz to 40 MHz.

20. A plasma treatment method according to claim 18, wherein said first frequency is in a range of 40 MHz to 100 MHz.

21. A plasma treatment method according to claim 18, wherein applying said energy is introducing microwave between said first and second electrodes.

22. A plasma treatment method according to claim 18, further comprising steps of:
supplying a second high frequency electric power of a second frequency to said second electrode;
supplying constant voltage to said first electrode; and
generating high frequency inductive field in said chamber for applying said energy.

23. A plasma treatment method according to claim 22, wherein supplying constant voltage is supplying ground potential.

24. A plasma treatment method according to claim 18, wherein applying said energy is applying electromagnetic wave by the side of a region between said first and second electrodes, and said plasma generated in said region by said electromagnetic wave is introduced in said space between said first and second electrodes.

* * * * *